(12) United States Patent
Crocker

(10) Patent No.: US 9,501,868 B2
(45) Date of Patent: *Nov. 22, 2016

(54) METHODS AND SYSTEMS FOR GENERATING AND EDITING SURFACES

(71) Applicant: IntegrityWare, Inc., San Deigo, CA (US)

(72) Inventor: Gary Arnold Crocker, San Diego, CA (US)

(73) Assignee: IntegrityWare, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/690,400

(22) Filed: Apr. 18, 2015

(65) Prior Publication Data

US 2015/0294501 A1  Oct. 15, 2015

Related U.S. Application Data

(63) Continuation of application No. 13/279,170, filed on Oct. 21, 2011, now Pat. No. 9,013,480.

(51) Int. Cl.
| | |
|---|---|
| *G06T 17/10* | (2006.01) |
| *G06T 17/20* | (2006.01) |
| *G06T 9/20* | (2006.01) |
| *G06T 17/00* | (2006.01) |
| *G06F 17/50* | (2006.01) |
| *G06T 7/00* | (2006.01) |
| *G06T 15/10* | (2011.01) |
| *G06T 7/20* | (2006.01) |
| *G06T 11/20* | (2006.01) |
| *G06T 9/00* | (2006.01) |
| *G06T 17/30* | (2006.01) |

(52) U.S. Cl.
CPC ............... *G06T 17/10* (2013.01); *G06F 17/50* (2013.01); *G06T 7/0028* (2013.01); *G06T 7/0083* (2013.01); *G06T 7/2033* (2013.01); *G06T 9/001* (2013.01); *G06T 9/20* (2013.01); *G06T 11/20* (2013.01); *G06T 15/10* (2013.01); *G06T 17/00* (2013.01); *G06T 17/20* (2013.01); *G06T 17/30* (2013.01); *G06T 2207/20096* (2013.01)

(58) Field of Classification Search
CPC ....... G06T 17/10; G06T 17/00; G06T 17/30; G06T 17/20; G06T 9/001; G06T 2219/2021; G06T 7/2033; G06T 7/0083; G06T 7/0028; G06T 9/20; G06T 11/20; G06T 15/10
See application file for complete search history.

(56) References Cited

U.S. PATENT DOCUMENTS

2007/0188490 A1\*  8/2007  Kanai et al. ................... 345/423

\* cited by examiner

*Primary Examiner* — Jeffrey Chow

(57) ABSTRACT

Methods and systems for generating surface data from polygonal data are disclosed. The methods and systems receive polygonal data which describe discrete points on an object. The methods and systems analyze and use the data to calculate and define a continuous BREP object which accurately represents the original polygonal object. In some embodiments, the BREP object is modified and certain details of the modification operations are recorded. The polygonal data may be edited and a new BREP object created based on the edited polygonal data. The new BREP object may be automatically modified by automatically reperforming the recorded modification operations.

20 Claims, 33 Drawing Sheets

Figure 2.3

METHODS AND SYSTEMS FOR GENERATING AND EDITING SURFACES

CROSS REFERENCE TO RELATED APPLICATIONS

This application is a continuation of application Ser. No. 13/279,170, filed Oct. 21, 2011, entitled "Methods and Systems for Generating and Editing Surfaces," which is incorporated herein by reference in their entirety for all purposes.

BACKGROUND

1. Field

The described technology relates to systems and methods of generating continuous surfaces from data of a polygonal model provided, from, for example, a 3-D polygonal or Subdivision surface (Sub-D) modeling tool.

2. Description of the Related Technology

Polygonal model data is created with, for example, a 3-D CAD software tool by, for example, a designer. The polygonal model or polygonal mesh includes discrete data points describing one or more surfaces or objects. Polygonal models are convenient for design work at least because they define the surface or object at a degree of detail convenient for the designer to work with. The shape of the surface or object is defined by the data points, and the surface between the data points is perceived, but is not represented in the data. This allows for the CAD system to function quicker because of a significantly reduced data set representing the surface or object, while providing the designer enough detail to manipulate to achieve a desired design.

Once the designer has finished the design, the polygonal data can be used, for example, as the basis for manufacturing a physical object or for generating an image of the designed object. To manufacture the object, or analyze it, or to generate the image, the mesh data is often not sufficient. For a physical object or a realistic image, a BREP object containing one or more surfaces must be defined. The surfaces are preferably Non-uniform rational B-spline (NURBS). NURBS is a mathematical model commonly used to represent curves and surfaces, which are either analytic or freeform. A BREP (Boundary REPresentation) may be understood to be a geometric and topological representation used, for example, in CAD applications that links together curves and surfaces to form either a solid (closed volume) or a shell (open).

For accurate CAD models, the continuity of the interior surface and the continuity between adjacent surfaces are important characteristics of the final product. Mathematically, for adjoining surfaces, continuity grades of G1 and G2 are defined. Each point on the final BREP object is a point on one or more surfaces. The continuity of the two surfaces at a point where they touch is characterized as G1 if the surfaces share a common tangent plane at the point. The continuity of two surfaces at the point is characterized as G2 if the surfaces share both a common tangent plane and common curvature at the point. For high quality surfaces G2 continuity at most points on the BREP object is highly desirable in terms of design aesthetics and manufacturability.

Prior to generation of the BREP object the polygonal data may be edited by a designer according to the designer's purposes. For example, the designer may add features to the object represented by the polygonal data using mesh operations. After generation of the BREP object, the designer may edit the BREP object. For example, the designer may add features to the object using BREP operations.

Once the BREP object has been edited, the designer may decide that a modification should be made, and that the modification can be made to the polygonal data, rather than the BREP object. In this situation, to implement the modification, the designer performs operations on the polygonal data, which does not include any of the features added using the NURBS operations. The designer modifies the polygonal data, and converts the modified polygonal data to NURBS data. The newly converted NURBS data, however, does not include any of the features the designer had previously created using the NURBS operations. To add the previously created NURBS features, the designer must reperform the operations to recreate the NURBS features again.

SUMMARY OF CERTAIN INVENTIVE ASPECTS

Various aspects of certain embodiments of methods and systems for generating surface data from polygonal data are discussed. The methods and systems receive polygonal data which describe discrete points on an object. The methods and systems analyze and use the polygonal data to calculate and define a continuous BREP object which accurately represents the object.

Some aspects provide a method of producing BREP data. The method includes accessing electronic data defining a mesh of data points, generating BREP data based on the mesh, and in response to a command from a user, performing one or more BREP operations on the BREP data. The method also includes after performing the BREP operations, in response to a command from the user, performing one or more mesh operations on the data points, whereby modified mesh data is generated, generating modified BREP data based on the modified mesh data, and in response to a command from the user, programmatically reperforming the one or more BREP operations on the modified BREP data, whereby updated BREP data is generated. The BREP operations are reperformed according to one or more of A) a location of a geometric feature of the modified BREP data, and B) a location of a geometric feature resulting from a reperformed BREP operation. The method also includes displaying the updated BREP data on the display, and storing the updated BREP data in the memory.

Some aspects provide a method of producing BREP data. The method includes accessing electronic data defining a mesh of data points, generating BREP data based on the mesh, and in response to a command from a user, adding a feature to the BREP data. The method also includes recording information in related to the added feature and related to adding the feature, after adding the feature, in response to a command from the user, performing one or more mesh operations on the data points, whereby modified mesh data is generated, and generating modified BREP data based on the modified mesh data. The method also includes in response to a command from the user, programmatically regenerating the feature, whereby updated BREP data is generated. The updated BREP data includes the added feature, and a location of the added feature is based on one or more of A) a location of a geometric feature of the modified BREP data, and B) a location of a geometric feature resulting from a regenerated feature. The method also includes displaying the updated BREP data on the display, and storing the updated BREP data in the memory.

DETAILED DESCRIPTION OF CERTAIN INVENTIVE EMBODIMENTS

Various aspects and features of methods and systems are described herein with reference to the accompanying drawings, which show certain exemplary embodiments. The described embodiments may be modified in various ways, without departing from the spirit or scope of the present invention. In addition, the described embodiments have multiple features and aspects, no single one of which is solely responsible for the desirable characteristics thereof. Furthermore, no single feature or aspect is essential to practicing the methods and systems described herein. Furthermore, various features and aspects of the embodiments may be combined in embodiments not specifically described.

Various inventive aspects of certain embodiments of methods and systems for generating BREP object data from polygonal data are discussed. The methods and systems receive polygonal data which describe discrete points on a object. The methods and systems analyze and use the data to calculate and define a BREP which accurately represents the polygonal object. For example, the methods and systems may receive polygonal data 1, such as that represented in FIG. 1 and generate a BREP 2, such as that represented in FIG. 2. Among other beneficial aspects, the BREP object defined by the methods and systems may be G2 continuous at all or substantially all points on the BREP object, and may be G1 continuous or substantially G1 continuous at any non-G2 continuous points. In addition, in some embodiments, the BREP object defined by the methods and systems interpolates all or substantially all of the points in the polygonal data. In some embodiments, the BREP object defined by the methods and systems includes all or substantially all of the points in the polygonal data. The methods and systems reliably define BREP objects for polygonal data of a wide variety of polygonal data. While quadrilateral polygonal data is most efficiently processed, some triangular polygonal data may be effectively handled. The BREP objects produced may contain mostly naturally trimmed (rectangular bounded) surfaces with a layout similar to what might be created by a designer in a CAD system. The flow lines of the resulting BREP curves and surfaces may closely match the flow lines of the straight edges on the original data mesh. Surfaces may be roughly rectangular, two manifold, and/or curved. Additionally, surfaces can be of any type, for example, NURBS surface, Bezier surface, Coons surface, Gregory Patch, etc.

Figure 1:
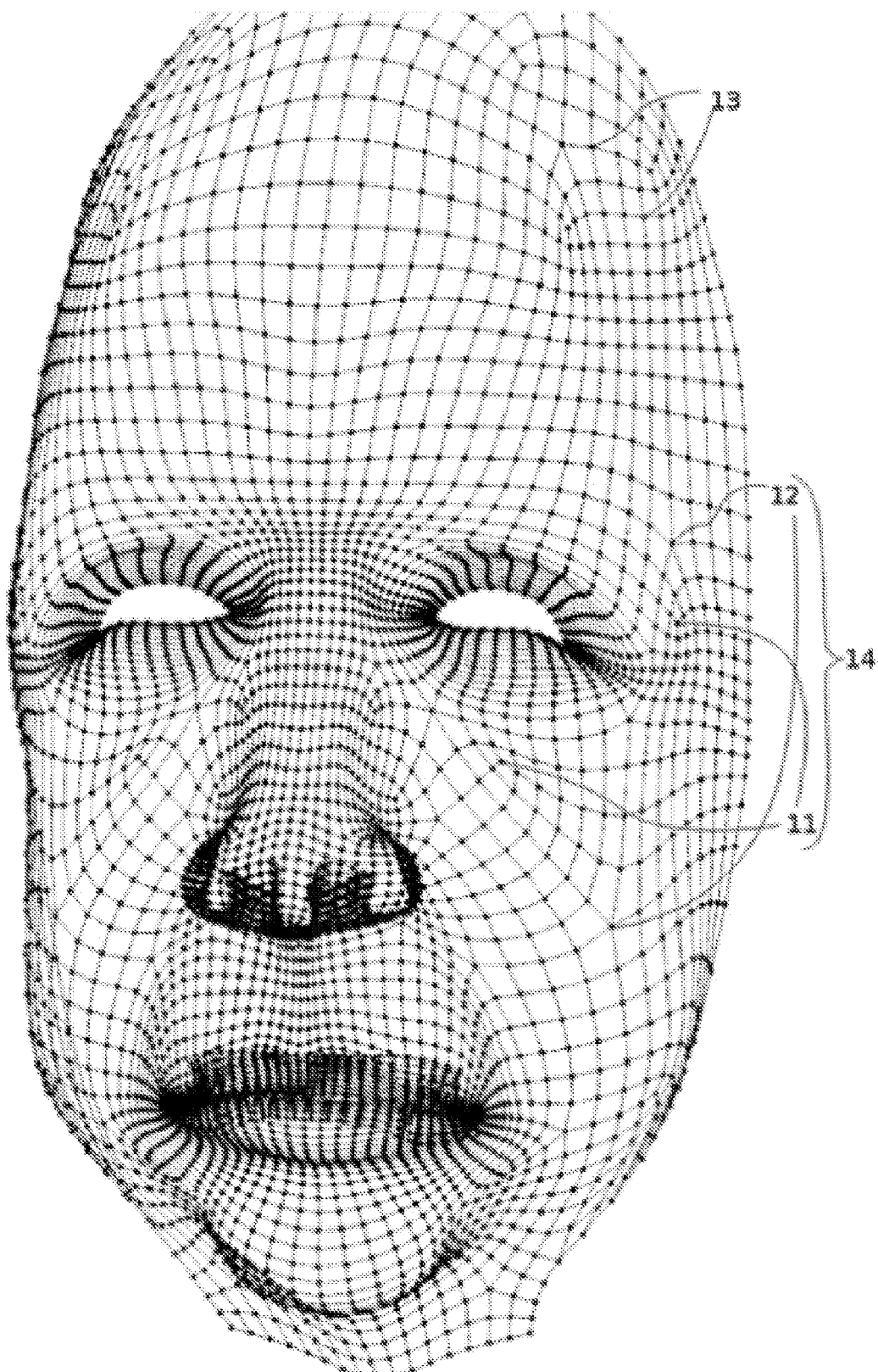
FIG. 1 is a graphical illustration of polygonal data.

A polygonal model or polygonal mesh can be characterized as being, for example, triangular or quadrilateral. In a predominantly triangular mesh, the polygons defined by the data are generally triangular. In a predominantly triangular mesh most polygons are defined by three data points, and each data point is generally a vertex of six triangles. The number of polygons defined by a point is referred to as the valence of that point. The valence of that point is also the number of polygon sides or lines which connect to that point. Accordingly, in a predominantly triangular mesh, most of the data points have a valence of six. In a predominantly quadrilateral mesh, the polygons defined by the data are generally quadrilateral. In a predominantly quadrilateral mesh most polygons are defined by four data points, and each data point is generally a vertex of four quadrilateral polygons. Therefore, in a predominantly quadrilateral mesh, most of the data points have a valence of four. FIG. 1 shows polygonal data 1, which is a predominantly quadrilateral mesh. Certain valence 3 points 11, valence 4 points 12, and valence 5 points 13, are indicated.

Figure 2:
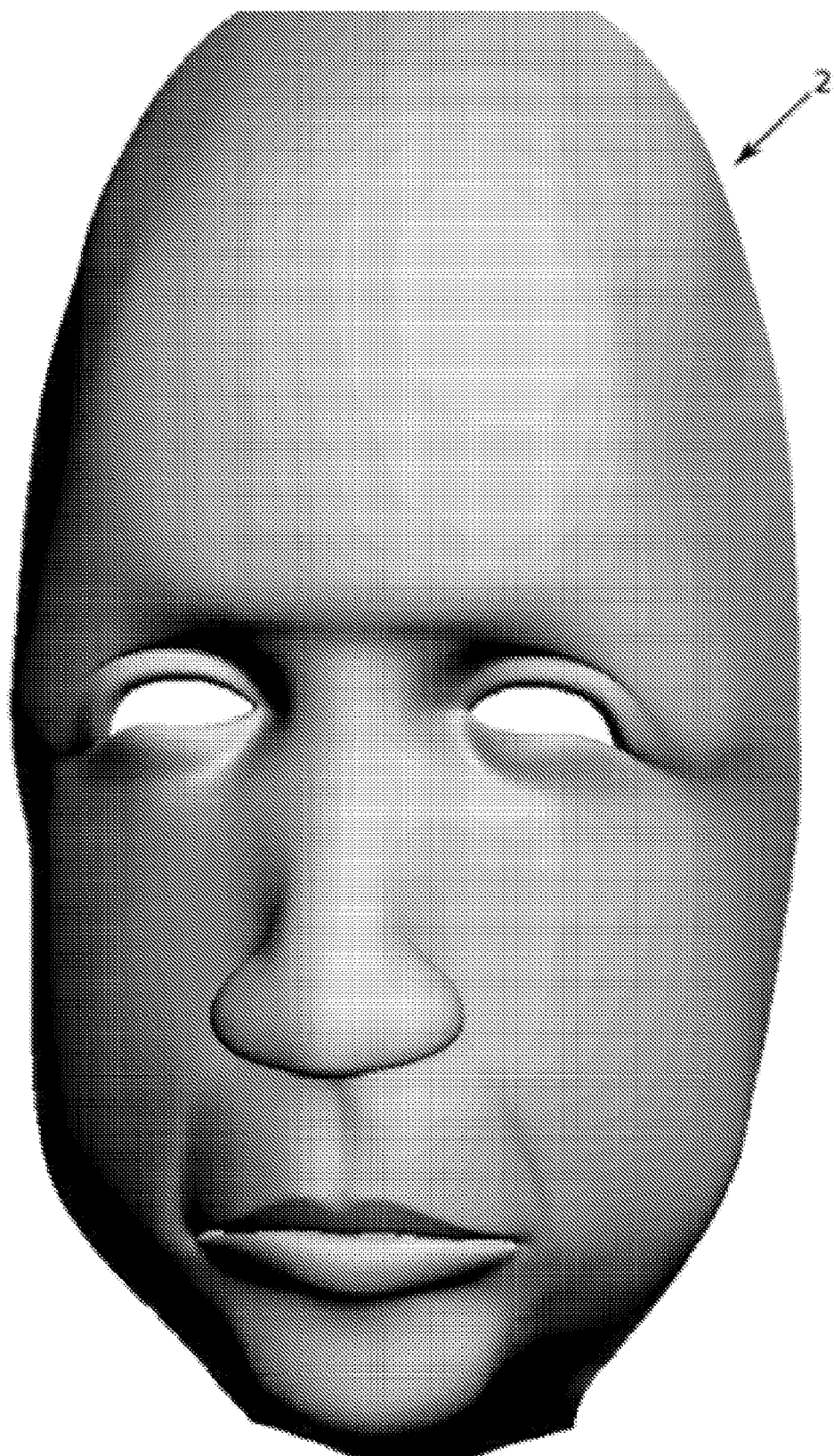
FIG. 2 is a graphical illustration of continuous BREP object data generated from the polygonal data of FIG. 1.

In some embodiments, methods and systems receive predominantly quadrilateral polygonal data representing an object. As indicated above, FIG. 1 shows an example of such data, and FIG. 2 shows an example of a continuous BREP object 2 corresponding to the surface represented by the polygonal data 1 shown in FIG. 1. In order to generate the continuous BREP object 2, in some embodiments the polygonal data 1 is analyzed and continuous surfaces are formed. The collection of continuous surfaces corresponds to the BREP object 2 represented by the polygonal data 1, where each surface corresponds to a unique portion of the BREP object 2 represented by the polygonal data 1. Each of the continuous surfaces forms a portion of the continuous BREP object 2 to be generated. To improve the continuity of the generated BREP object 2, the boundaries and vertices of the continuous surfaces are modified. The result is a continuous BREP object 2 corresponding to the BREP object represented by the polygonal data 1.

Figure 3:
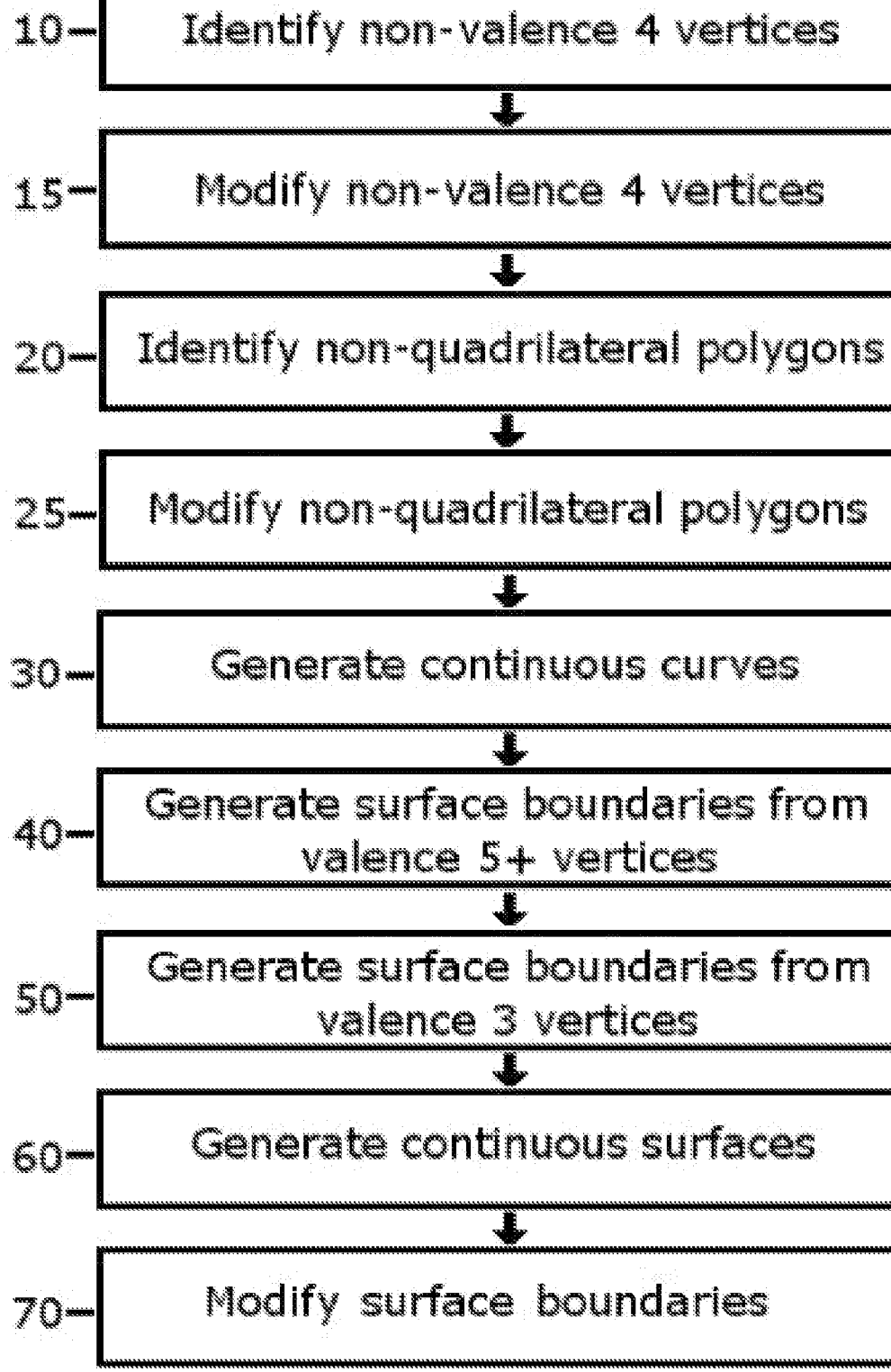
FIG. 3 is a flow chart of a method used to generate the continuous BREP object data of FIG. 2.

FIG. 3 is a flow chart describing a method of generating BREP object data, such as that represented in FIG. 2, from polygonal data, such as that represented in FIG. 1. The method of FIG. 3 is implemented with a computer system, which accesses instructions for performing the method stored on a computer readable medium, such as a memory or data storage device. The instructions, when executed by the computer, cause the method of FIG. 3 to be performed. The polygonal data may be generated with a computer CAD system and may be stored in a non-transitory computer readable medium, such as a memory or data storage device.

The computer system configured to perform or to be used to perform the method of FIG. 3 accesses the polygonal data to perform the method.

At 10 of FIG. 3, polygonal data 1 is analyzed to identify vertices which are not valence 4. Several valence 3 vertices 11 and several valence 5 vertices 12 are indicated in FIG. 1. Some polygonal data has vertices with valence higher than 5. In some instances, as a result of the method used to generate the polygonal data 1, vertices having valence 3 or having valence higher than 4 often correspond to points in the polygonal data 1 with poor continuity. As discussed in more detail below, adjustments may be made to the polygonal data 1 at or near the non-valence 4 points 14 to improve continuity of the generated BREP object. In some polygonal data 1, vertices at a boundary of the surface represented may be non-valence 4. In some embodiments, such non-valence 4 boundary vertices are excluded from the vertices identified as non-valence 4 at 10 of FIG. 3.

Figure 4:
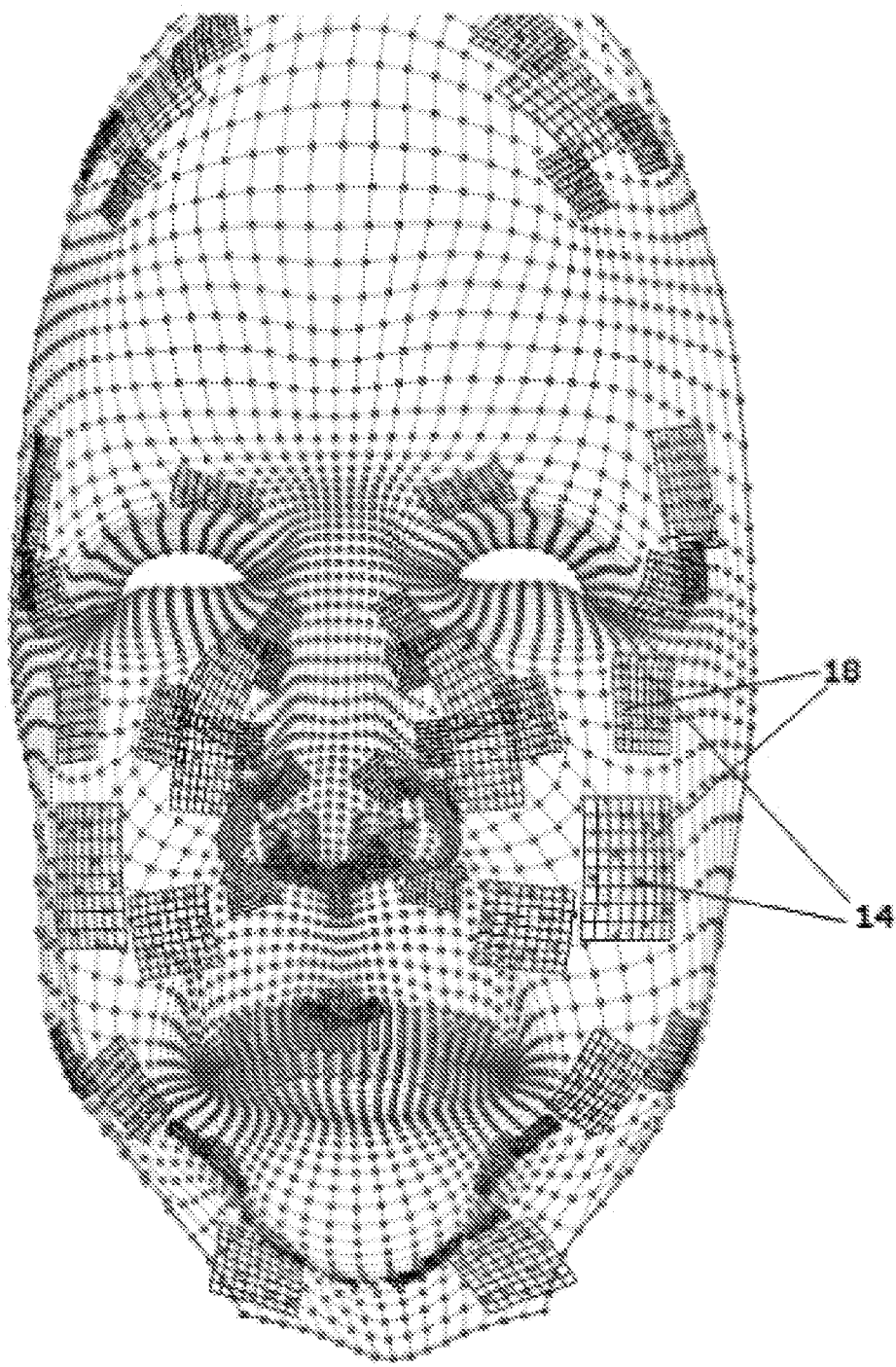
FIG. 4 is a graphical illustration of the polygonal data of FIG. 1 with surfaces for non-valence 4 vertices.

At 15 of FIG. 3, the non-valence 4 vertices 14, or data points corresponding to the non-valence 4 vertices 14 are modified based on nearby vertices to improve continuity across points on the generated BREP object corresponding to the non-valence 4 vertices 14. In some embodiments, as shown in FIG. 4, continuous surfaces 18 are generated using vertices which are near the non-valence 4 vertices 14 whose continuity is to be improved. For example, all and/or only the vertices adjacent to a non-valence 4 vertex 14 can be used to generate a G2 continuous surfaces 18. In some embodiments, the non-valence 4 vertex 14 itself is not used in the BREP object or surface generation. In some embodiments, they are. In some embodiments, vertices used to generate the continuous surfaces 18 include vertices within 2, 3, 4, 5, or about 10 vertices of the non-valence 4 vertex 14. In some embodiments a group of vertices which substantially surrounds the non-valence 4 vertex 14 are included. In some embodiments, vertices used to generate the continuous surfaces 18 are limited to vertices within 2, 3, 4, 5, or about 10 vertices of the non-valence 4 vertex 14. In some embodiments, vertices used to generate the continuous surfaces 18 include about 0.001%, about 0.01%, about 0.1%, or about 1% of vertices in the polygonal data nearest the non-valence 4 vertex 14. In some embodiments, vertices used to generate the continuous surfaces 18 are limited to about 0.001%, about 0.01%, about 0.1%, or about 1% of vertices in the polygonal data nearest the non-valence 4 vertex 14.

Some techniques for generating continuous surfaces include variational surfacing and/or least squares fitting. Other surface generation techniques may additionally or alternatively be used, such as other ordered data fitting techniques. In some embodiments, the generated surface is a NURBS surface. Alternatively, the generated surface may, for example, be another type of surface, such as a Bezier surface, a Coons surface, a Gregory Patch, etc.) The generated surface may be G2 internally continuous. In some embodiments, the surface is not G2 internally continuous. Internal surface continuity is generally the continuity of a surface inside of the surface boundary.

Once the surface is generated, the non-valence 4 vertex 14 is projected onto the surface 18 at a projection point where the surface is normal to the position of the non-valence 4 vertex 14. The projection point is then used to modify the non-valence 4 vertex 14 in the polygonal data. For example, the non-valence 4 vertex 14 in the polygonal data may be replaced with data representing the position of the projection point, data representing the position of the projection point may be stored in data representing the BREP surface to be generated, or data representing the position of the projection point may be stored for later use in calculating the data representing the BREP surface to be generated. In some embodiments, the normal vector including the projection point and the unmodified non-valence 4 vertex 14 is stored and used in the generation of 3D curves.

At 20 of FIG. 3, the polygonal data is analyzed to identify polygons which are not quadrilateral. Some polygonal data has polygons which are triangles, or have more than 4 sides. In some instances, polygons which are not quadrilateral may correspond to points in the generated surface with poor continuity. As discussed in more detail below, adjustments may be made to the polygonal data at or near the non-quadrilateral polygons to improve continuity of the generated BREP object.

At 25 of FIG. 3, the non-quadrilateral polygons are modified based on nearby vertices to improve boundary continuity across points on the generated BREP object corresponding to the non-quadrilateral polygons. Vertices included for use to improve the boundary continuity may be included for reasons similar to those discussed above regarding inclusion of vertices for improving continuity of the generated BREP data near non-valence 4 vertices. In some embodiments, continuous surfaces are generated using vertices which are near the non-quadrilateral polygons whose continuity is to be improved. For example, all the vertices adjacent to a non-quadrilateral polygon can be used to generate a G2 continuous surface. In some embodiments, the vertices of the non-quadrilateral polygon itself are not used in the surface generation. In some embodiments, they are. In some embodiments, vertices within two vertices of the non-quadrilateral polygon are used to generate the continuous surface. Such surfaces may be similar to those shown in FIG. 4 near non-valence 4 vertices.

Once the surface is generated, the vertices of the non-quadrilateral polygon are projected onto the surface at points where the surface is normal to the position of each of the vertices. The surface points of the projection are then used to modify the vertices of the non-quadrilateral polygon in the polygonal data. For example, the vertices of the non-quadrilateral polygon in the polygonal data may be replaced with data representing the positions of the surface points, data representing the positions of the surface points may be stored in data representing the surface to be generated, or data representing the positions of the surface points may be stored for later use in calculating the data representing the surface to be generated. In some embodiments, the normal vectors including the surface points and the unmodified non-quadrilateral vertices are stored.

Figure 5:
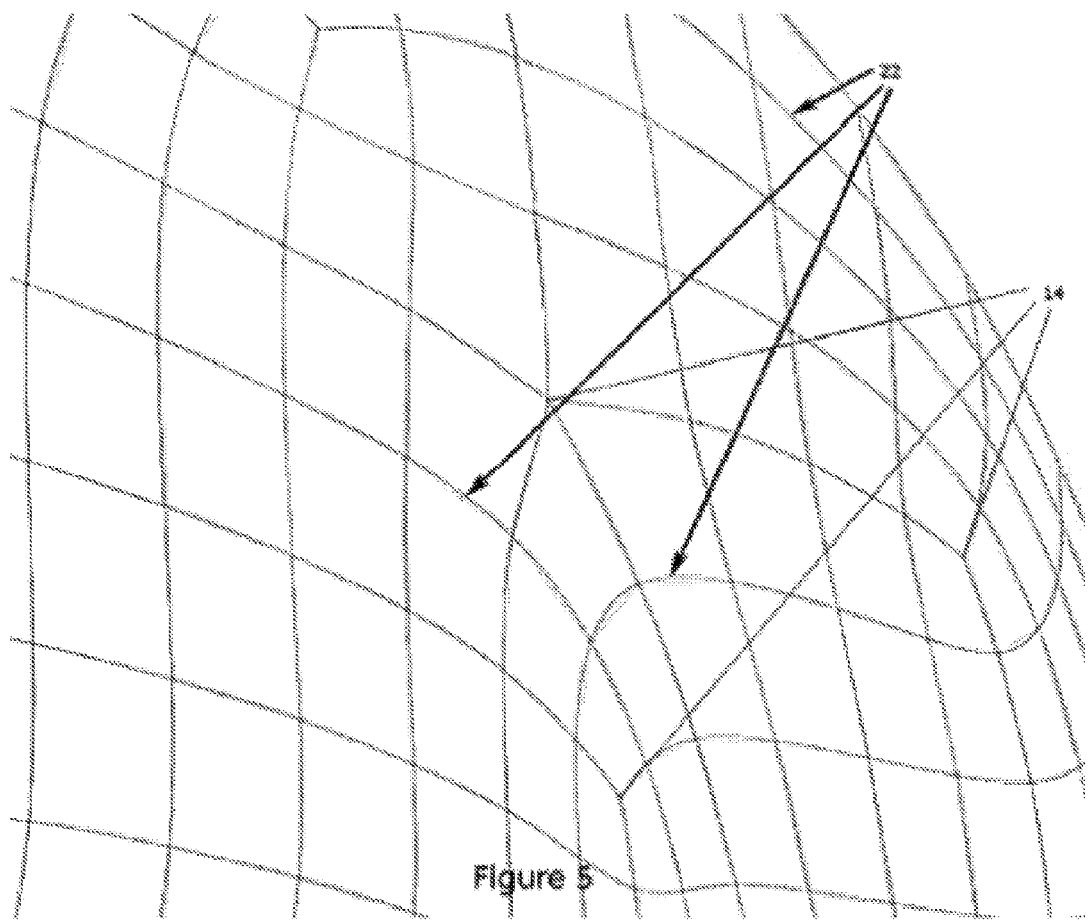
FIG. 5 is a graphical illustration of continuous curves generated based on the polygonal data of FIG. 1.

At 30 of FIG. 3, the valence 4 vertices 13 are used to create continuous curves. As shown in FIG. 5, continuous curves 22 including the points of the polygonal data vertices are generated. Alternatively, continuous curves may be generated based on the polygonal data, but not necessarily including the polygonal data points. A technique, such as least squares fitting, may be used to generate the curves 22 through the valence 4 vertices. Other techniques may additionally or alternatively be used. In some embodiments, the generated curves 22 are NURBS curves. The generated curves 22 may be G2 continuous. In some embodiments, the curves 22 are not G2 continuous. The curves 22 have end points which are at the boundaries of the polygonal data or which are at non-valence 4 vertices 14. On non-valence 4 vertices, modified points from the surfaces generated in 15 of FIG. 3 and optionally the corresponding surface normals may be used to generate the curves 22. A plane may be defined by the center point (of the generated surface) and the corresponding surface normal at that point. The curves 22 may be generated so that they are tangent at the common center point so that their curve tangents lie substantially on the same plane. The center point is used as an end point of the curves 22. The generated curves 22 are used to define the continuous surfaces discussed above.

Figure 6:
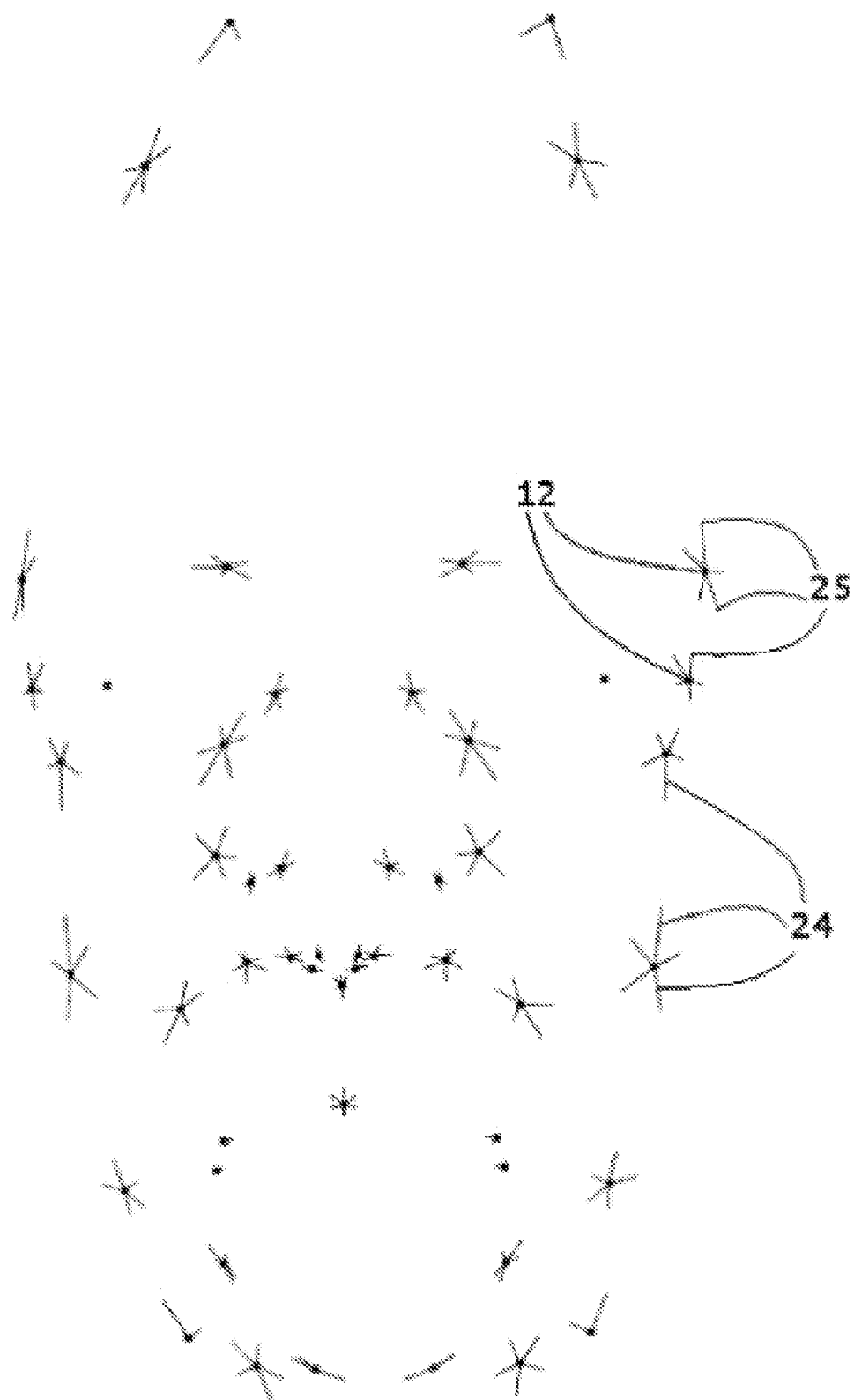
FIGS. 6-13 are graphical illustrations of an embodiment of surface boundary generation.

At 40 of FIG. 3 surface boundaries are defined using the vertices 12 having valence 5 and higher. In some embodiments, data points corresponding to vertices 12 having valence 5 and higher are used to define the surface boundaries. As shown in FIG. 6, boundary segments 24 are formed. The boundary segments start with the vertices 12 having valence 5 and higher and end with the vertices 25 adjacent to the vertices 12 having valence 5 and higher, and include the continuous curve between the start and end vertices. To further define the surface boundaries, the boundary segments 24 are conditionally extended until no boundary segments 24 may be further extended. The rules for conditionally extending the boundary segments may or may not include:

Boundary segments 24 are extended from valence 4 vertices so as to continue along the same continuous curve generated in 30 of FIG. 3.

Boundary segments 24 are not extended if the last included vertex is non-valence 4.

Curves along the boundary of the polygonal data form boundary segments.

Boundary segments 24 are not extended if the last included vertex is in another boundary segment.

Boundary segments 24 are not extended if areas of high curvature change are found To determine areas of high curvature change, a mathematical test, such as a threshold on a third derivative at the next or last included vertex may be used. For example if the third derivative at the last included vertex is greater than a threshold, the boundary segment 24 may not be extended. Alternatively, if the second derivative at the included vertex is greater than the second derivative at the previous vertex of the boundary segment 24 by a factor greater than a threshold, such as about 1.5, about 2, or about 5, the boundary segment 24 may not be extended.

In some embodiments, if a boundary segment 24 is terminated at a vertex of high curvature change, which has a valence of 4, additional boundary segments (not shown) are generated. The additional boundary segments start from the vertex of high curvature change, and extend in both directions along the continuous curve which intersects the continuous curve along which the terminated segment 24 was being extended. In some embodiments, a boundary segment is additionally started from the vertex of high curvature change and is extended in the direction along the continuous curve along which the terminated segment 24 was being extended. Extending the boundary segments from the data points corresponding to vertices of high curvature change may be performed according to the rules for extending boundary segments discussed above.

Figure 7:
Figure 8:
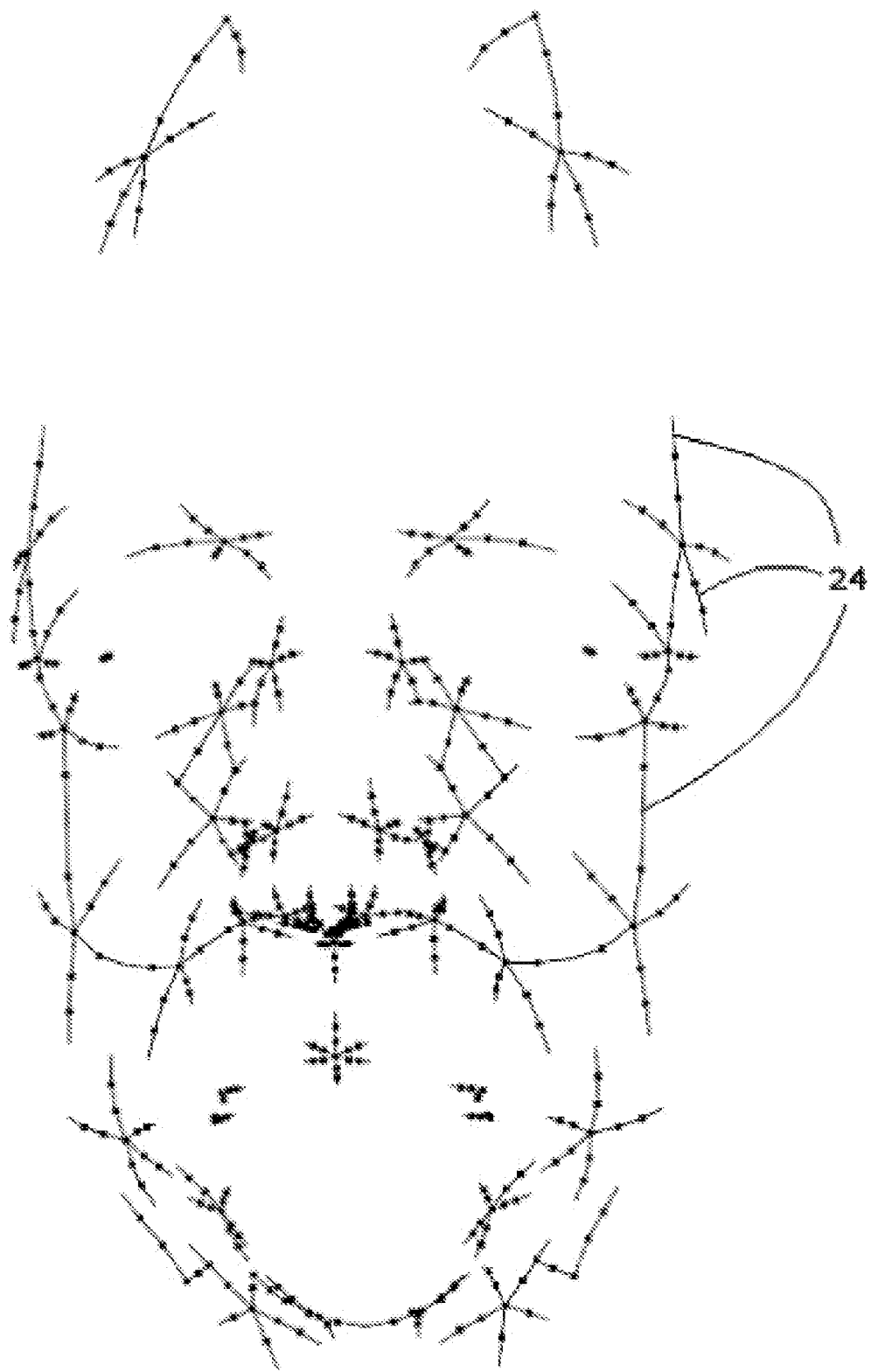
Figure 9:
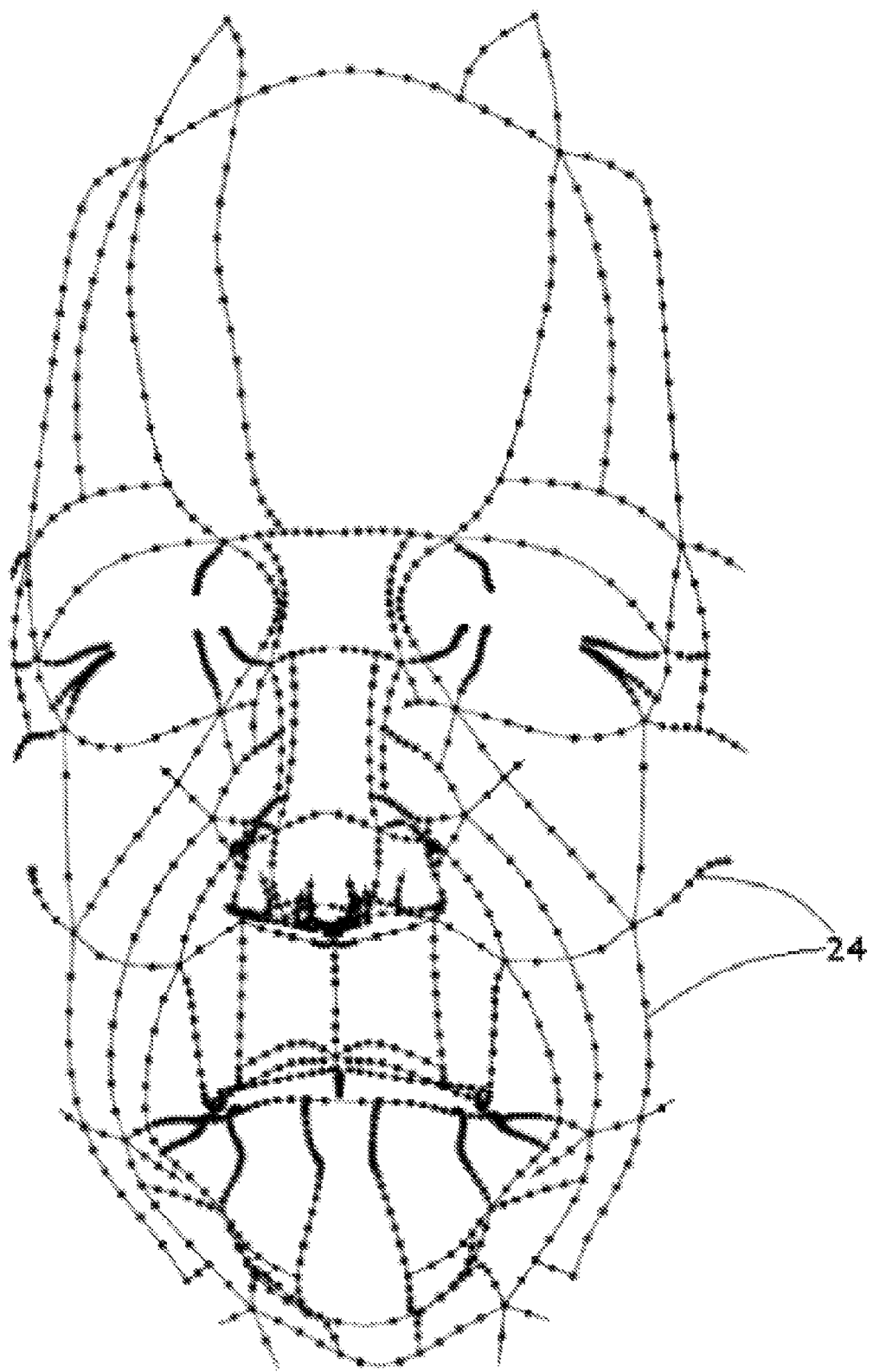

FIGS. 7 and 8 show progressive extensions of the surface boundary segments 24 started in FIG. 6. FIG. 9 shows the result of the boundary segments 24 starting with vertices having valence 5 or higher being fully extended.

Figure 10:
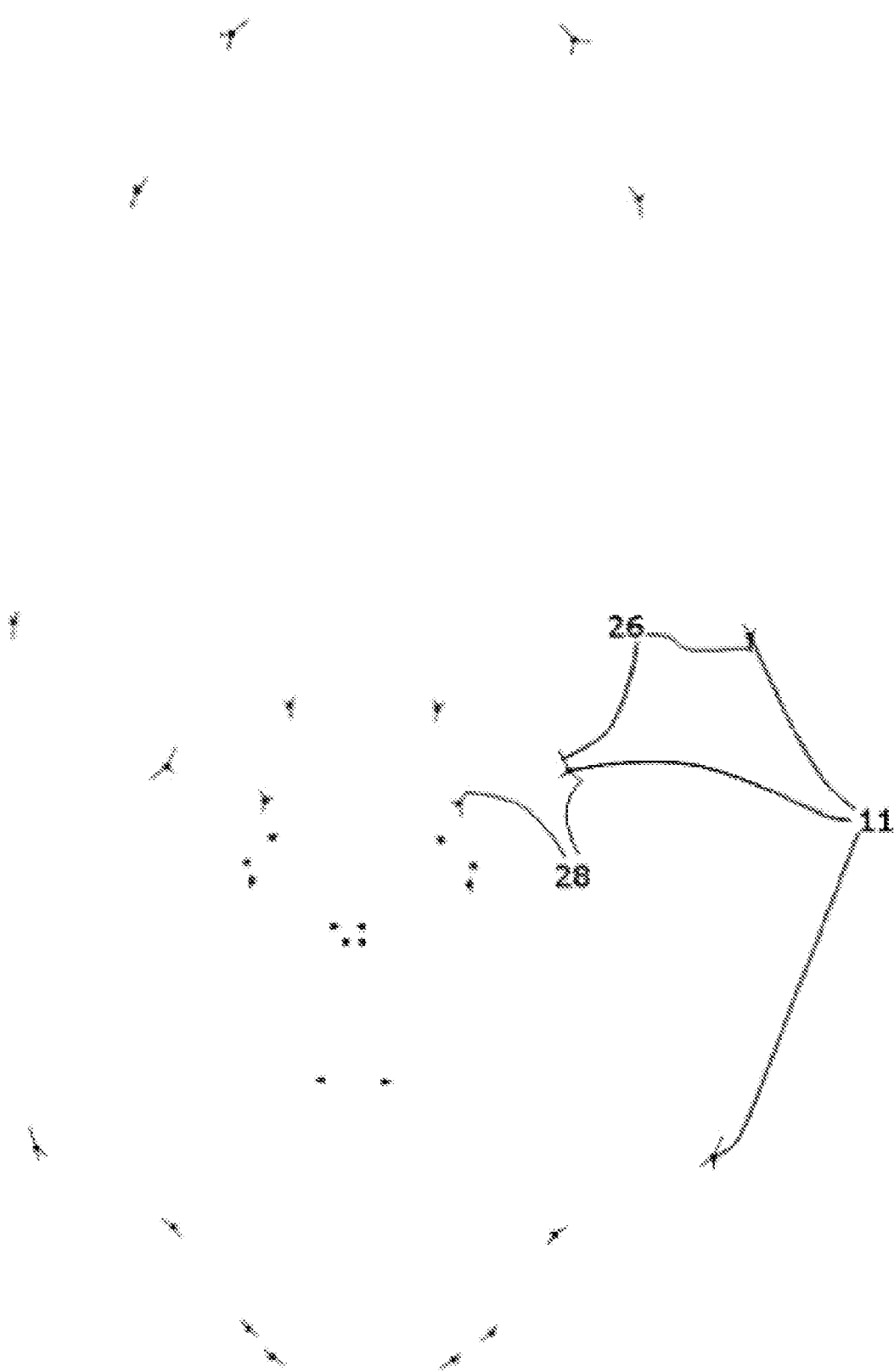

At 50 of FIG. 3 surface boundaries are defined using the vertices 11 having valence 3. As shown in FIG. 10, boundary segments 26 are formed starting with the vertices 11 having valence 3 and ending with the vertices 28 adjacent to the vertices 11 having valence 3, and include the continuous curve between the start and end vertices. To further define the boundaries, the boundary segments 26 are conditionally extended in a manner similar to the boundary segments 24 generated from the vertices having valence greater than 4. The rules for conditionally extending the boundary segments 26 may or may not include:

Boundary segments 26 are extended from valence 4 vertices so as to continue along the same continuous curve defined in 30 of FIG. 3.

Boundary segments 26 are not extended if the last included vertex is non-valence 4.

Curves along the boundary of the polygonal data form boundary segments.

Boundary segments 26 are not extended if the last included vertex is in another boundary segment.

Boundary segments 26 are not extended if areas of high curvature change are found In some embodiments, if a boundary segment 26 is terminated at a vertex of high curvature change, which has a valence of 4, additional boundary segments (not shown) are generated. The additional boundary segments start from the vertex of high curvature change, and extend in both directions along the continuous curve which intersects the continuous curve along which the terminated segment 26 was being extended. In some embodiments, a boundary segment is additionally started from the vertex of high curvature change and is extended in the direction along the continuous curve along which the terminated segment 26 was being extended.

In some embodiments, data points corresponding to vertices of high curvature change (for example, at the boundary of a flat surface and a surface with high curvature) are identified in the polygonal data independent of the process of extending boundary segments. The identified data points may be subsequently used as starting points for generating boundary segments using a process similar to those described above.

In some embodiments, the surface boundary segments are iteratively extended, such that during each iteration, each of the boundary segments being extended is extended to include an additional point which at least one of corresponds to a vertex of the polygonal data and is included on one of the continuous curves generated at 30 of FIG. 3. In some embodiments, all of or only the surface boundaries extended from vertices 12 having valence 5 and higher are extended during an iteration. In some embodiments, all of or only the surface boundaries extended from vertices 11 having valence 3 are extended during an iteration. In some embodiments, all of or only the surface boundaries extended from vertices of high curvature change are extended during an iteration.

In some embodiments, all of or only the surface boundaries extended from vertices 12 having valence 5 and higher are extended before surface boundaries extended from other vertices. In some embodiments, all of or only the surface boundaries extended from vertices 11 having valence 3 are extended before surface boundaries extended from other vertices. In some embodiments, all of or only the surface boundaries extended from vertices of high curvature change are extended before surface boundaries extended from other vertices.

Alternatively, all surface boundaries or surface boundaries started from vertices 12 having valence 5 and higher, vertices 11 having valence 3, and vertices of high curvature change may be extended during a single iteration.

In some embodiments, data points of the non-quadrilateral polygons are used as starting points from which boundary segments are extended. A process for extending the boundary segments form data points of the non-quadrilateral polygons may be similar to those discussed above.

Figure 11:
Figure 12:
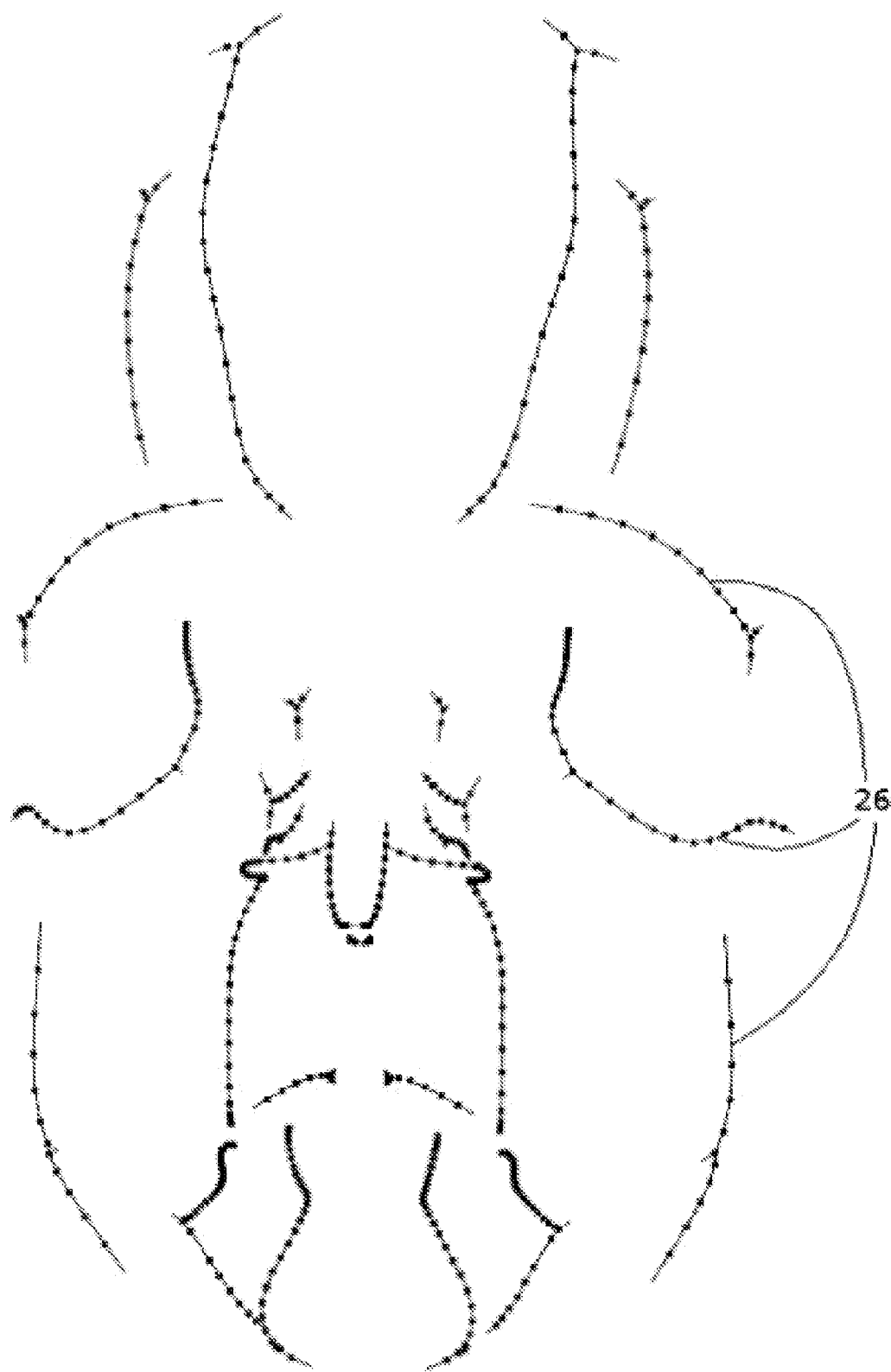
Figure 13:
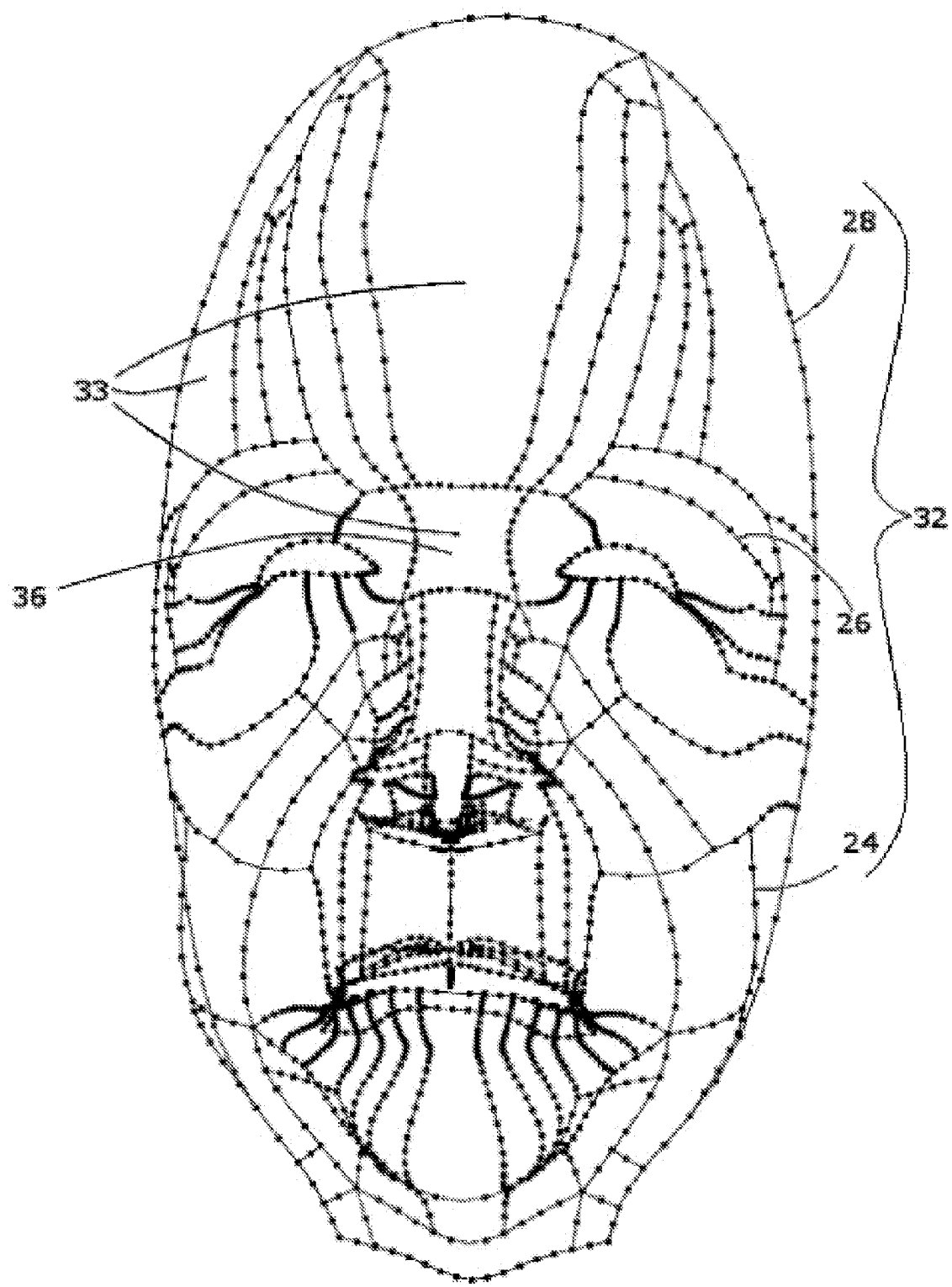

FIG. 11 shows extensions of the surface boundary segments 26 formed in FIG. 10. FIG. 12 shows the result of the boundary segments 26 starting with vertices 11 having valence 3 being fully extended. FIG. 13 shows the result of the boundary segments 24 starting with vertices 12 having valence 5 or higher being fully extended and the boundary segments 26 starting with vertices 11 having valence 3 being fully extended. Also shown in FIG. 13, with the addition of the surface boundary segments 28 defined by the continuous curves generated in 30 which include boundary vertices of the polygonal data, the surface boundaries 32 are fully formed and define the boundaries for the surfaces to be generated for surface locations 33 of the surface.

Figure 14:
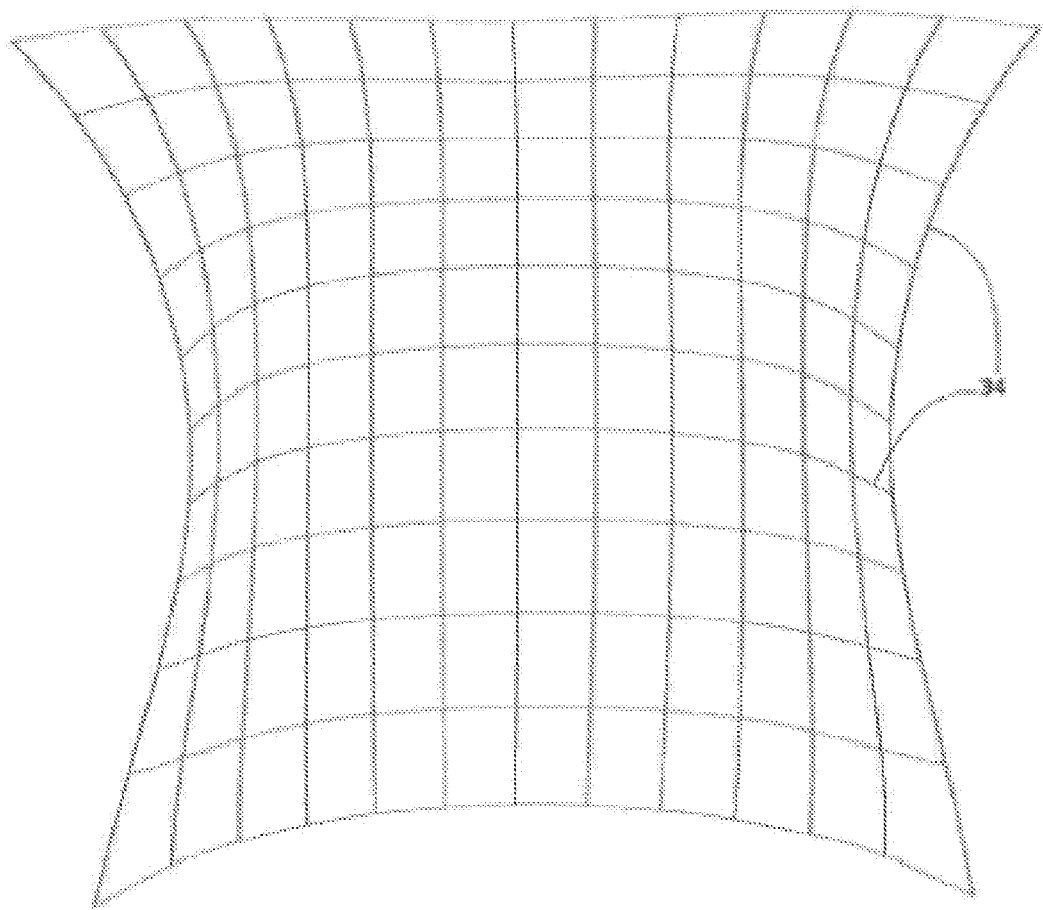
FIGS. 14-16 are graphical illustrations of surface generation.
Figure 15:
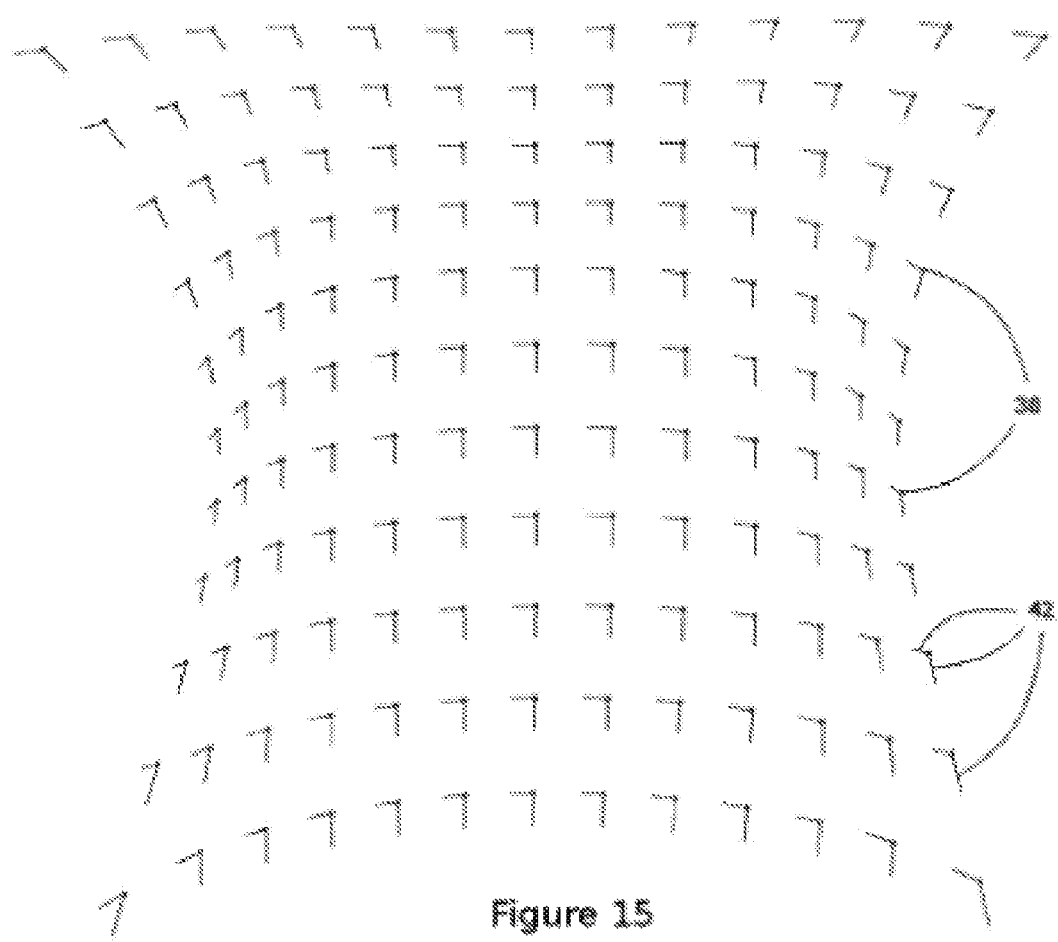

At 60 of FIG. 3, continuous surfaces are generated for each area 33 of the mesh surrounded by boundary segments. Portions 34 of the continuous curves generated at 30 of FIG. 3 which are within the bounded areas 33 are used to generate the surface for each area 33. Such a set of curve portions 34 is shown in FIG. 14, which shows curve portions 34 for a surface location 36 between the eyes, as shown in FIG. 13. FIG. 15 shows the vertices 38 in the surface location 36 along with tangent vectors 42 at each vertex. The tangent vectors 42 represent the slopes of the continuous curve portions 34 at the vertices 38.

Figure 16:
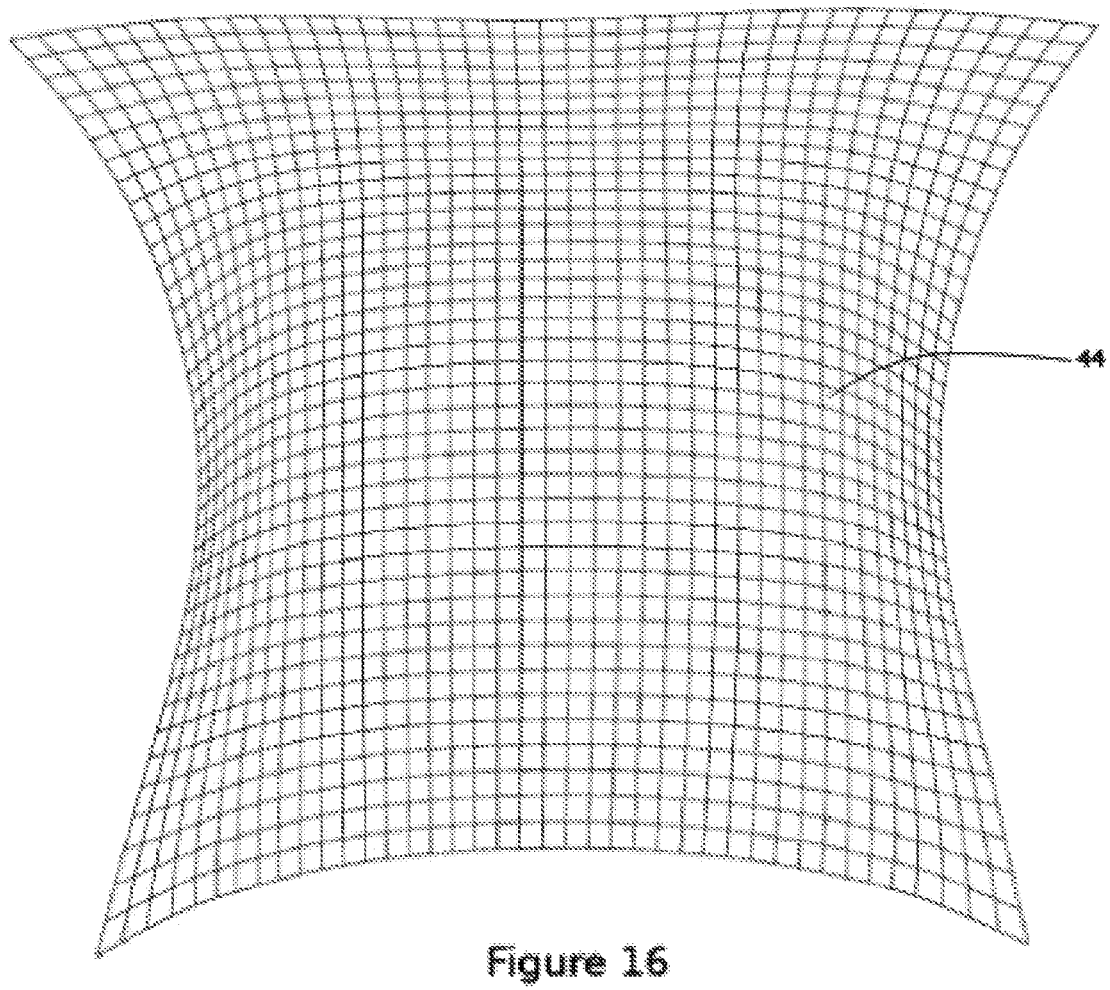

The curve portions 34, as shown in FIG. 14, and the tangent vectors 42, as shown in FIG. 15 may be used by a surface generation technique to define a continuous surface. FIG. 16 is a representation of the surface 44, which is a continuous surface 44 generated from the curve portions 34 of FIG. 14 and the tangent vectors 42 of FIG. 15. Some techniques for generating the continuous surface 44 include variational surfacing and/or least squares fitting. Other surface generation techniques may additionally or alternatively be used, such as another unordered data fitting technique. In some embodiments, the generated surface is a NURBS surface. The surface may be another type of surface. The generated surface may be G2 continuous. In some embodiments, the surface is not G2 continuous.

In order to generate the continuous BREP object corresponding to all of the polygonal data, a continuous surface is generated for each area 33 surrounded by boundary segments. The collection of continuous surfaces forms the continuous BREP corresponding to all of the polygonal data. Because the curves used to generate the surfaces are continuous the surfaces are internally continuous. In addition, the surface boundaries are continuous where the vertices on the boundary have valence 4. This is the case because the curves which cross the boundaries at vertices having valence 4 are continuous, as discussed above with reference to 30 of FIG. 3. Therefore, to improve the continuity of the entire generated BREP, at 70 of FIG. 3, the boundaries of the continuous surfaces near non-valence 4 vertices are analyzed and modified where needed.

Figure 17:
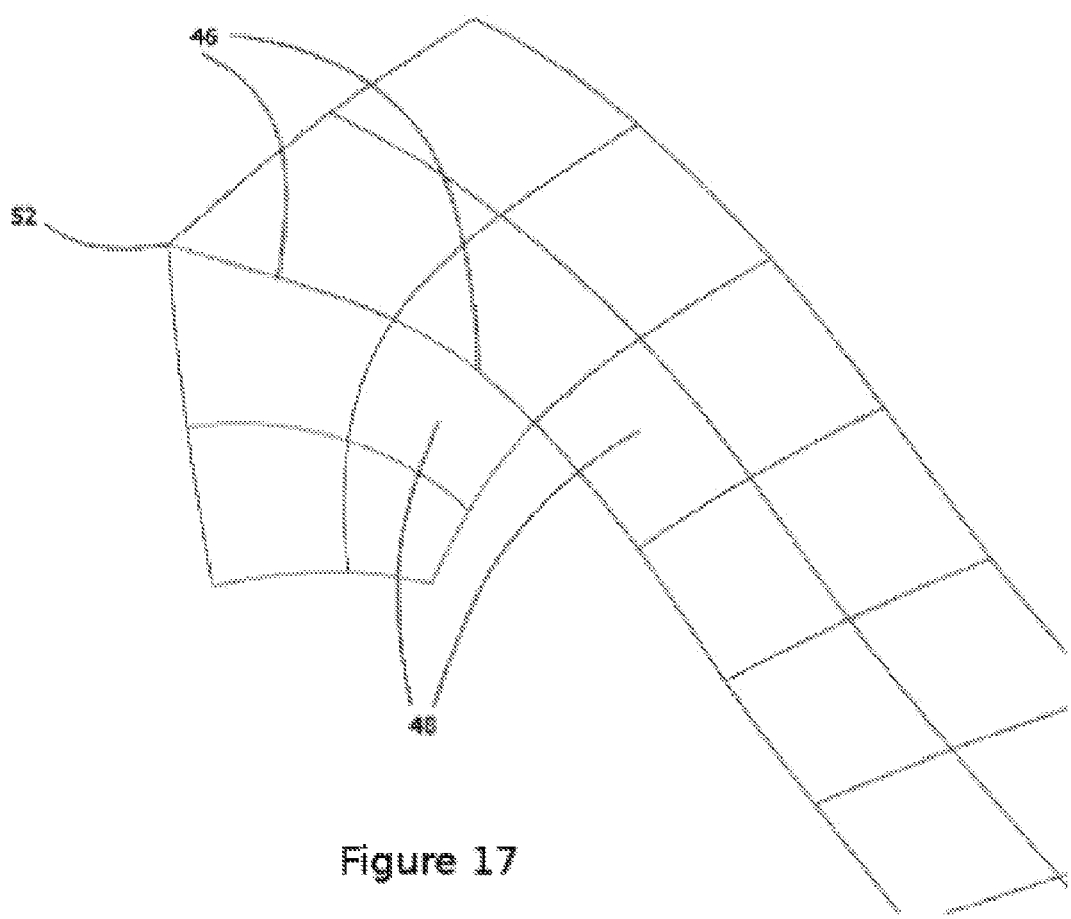
FIGS. 17-22 are graphical illustrations of surface boundary continuity improvement.
Figure 18:
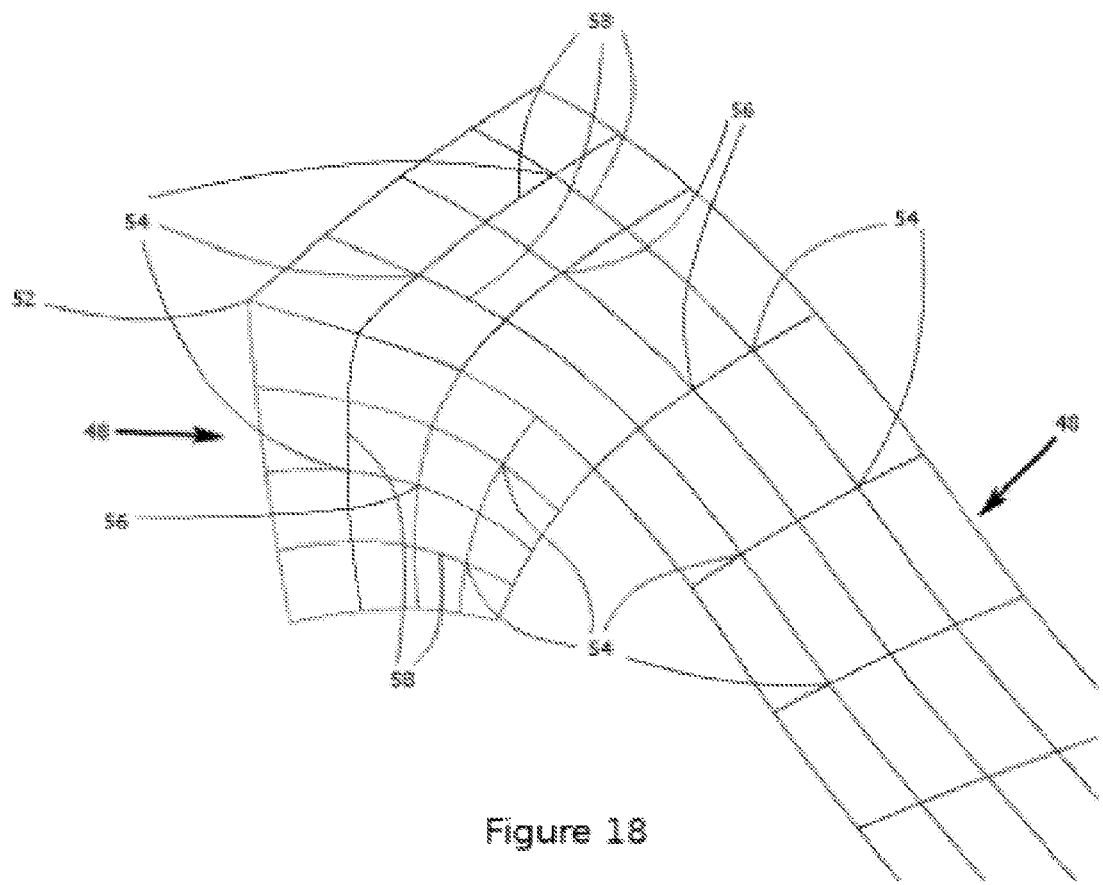

At some boundaries between a non-valence 4 vertex and the adjacent valence 4 vertex along the boundary, an unacceptable discontinuity may exist. FIG. 17 shows a boundary 46 between two surfaces 48 which has a valence 5 vertex 52. To determine and address the discontinuity, new knots 54 are added to the surfaces 48 sharing the boundary. The new knots 54 are added, as shown in FIG. 18 so as to be between the previously existing vertices 56. In some embodiments, the added knots 54 are located at a middle point between the previously existing vertices 56. While the discontinuity is concentrated near the non-valence 4 vertex 52, new knots 54 are added around the entire perimeter of each surface 48 to avoid high aspect ratio portions of the surface data near the non-valence 4 surface vertex 52. Using a process similar to that discussed above with reference to FIG. 14, continuous curves 58 are generated from the new vertices 56 on each surface 48, as shown in FIG. 18. In addition, using a process similar to that discussed above with reference to FIG. 15, tangent vectors 62 are determined at each of the old and new vertices, as shown in FIG. 19.

Figure 19:
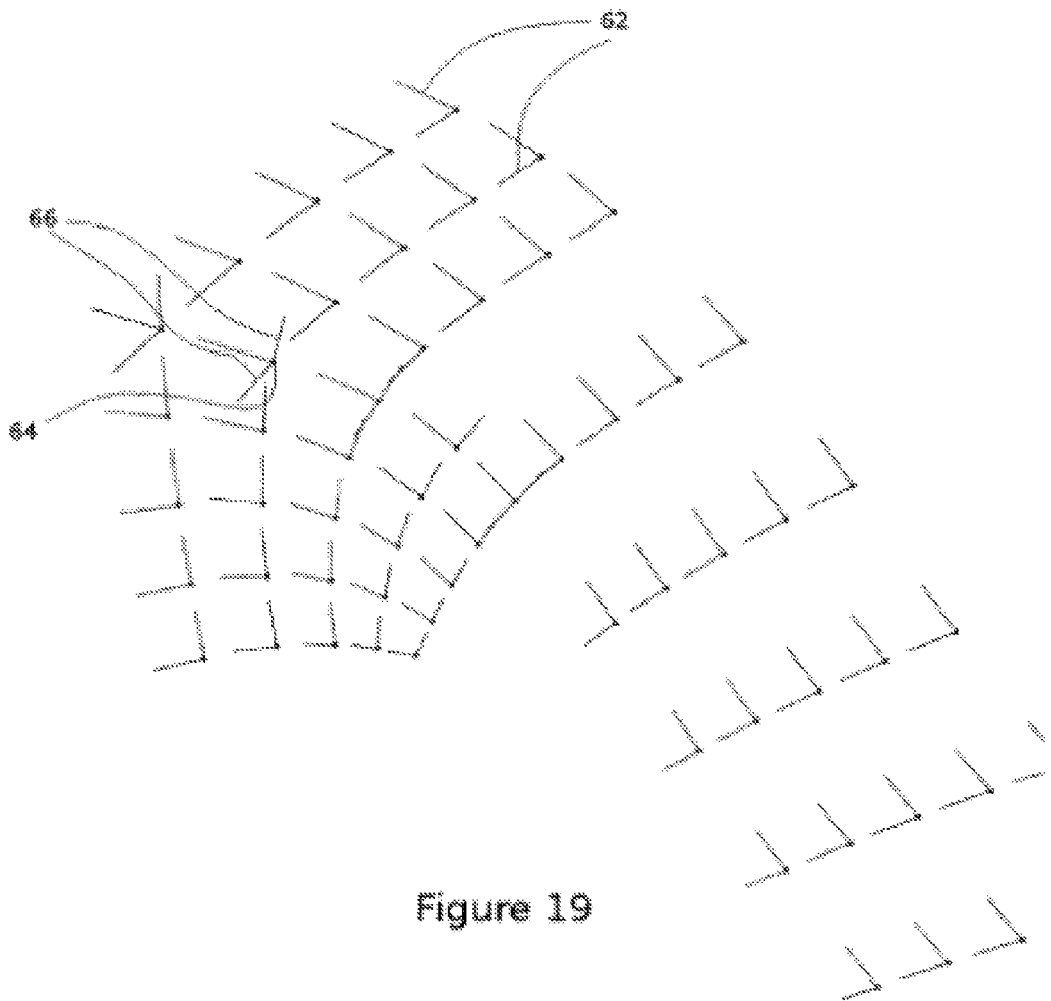
Figure 20:
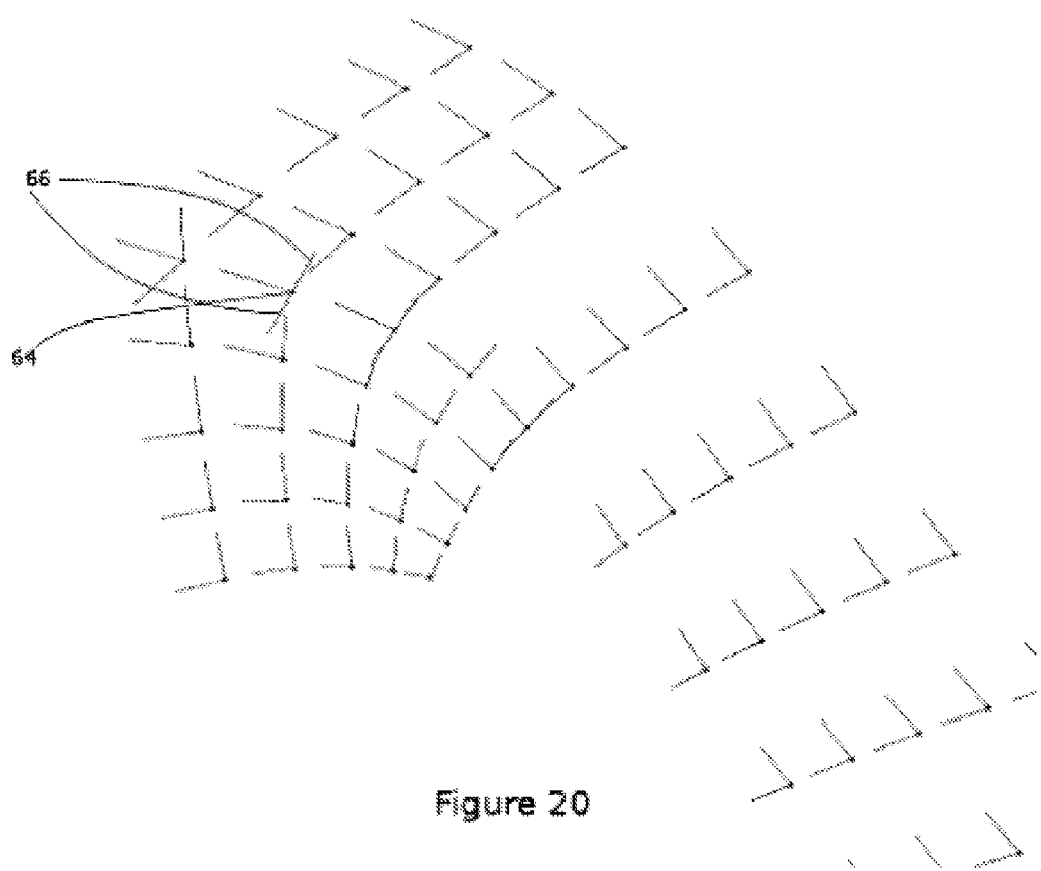
Figure 21:
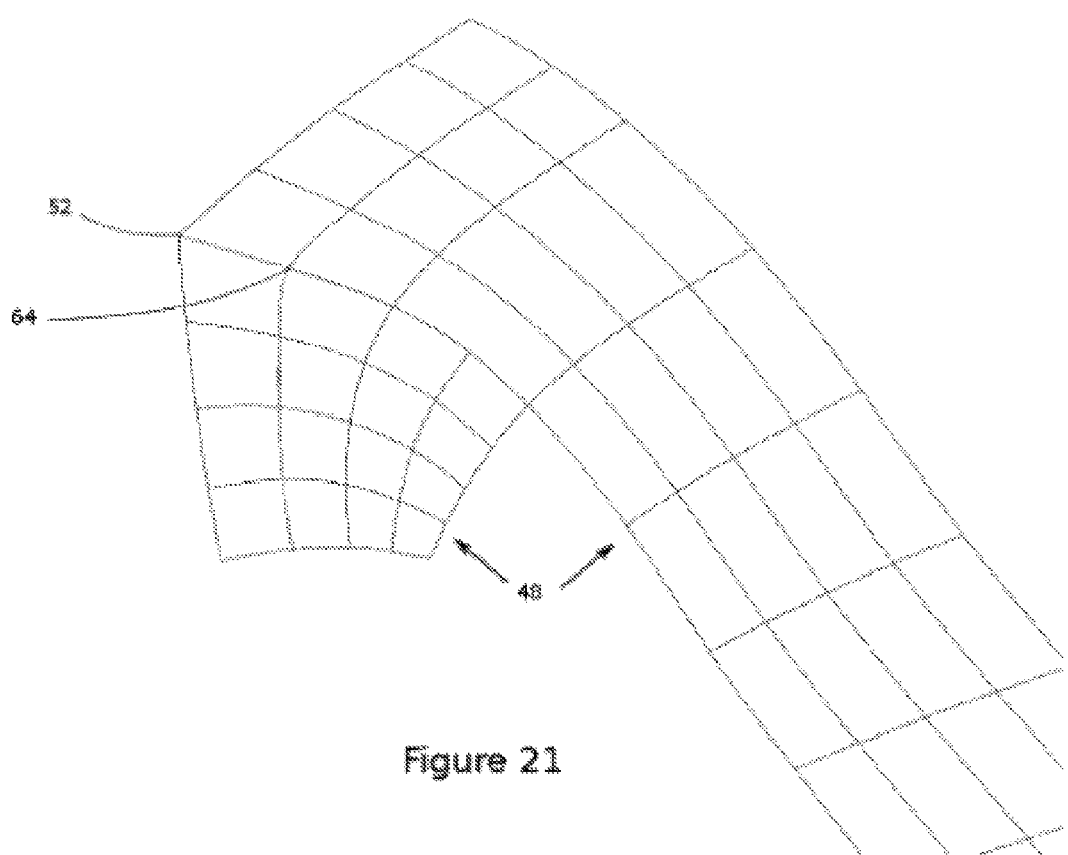

As shown in FIG. 19, the new vertex 64 on the boundary nearest the valence 5 vertex has two tangent vectors 66. The tangent vectors 66 are from the continuous curves of both surfaces 48 sharing the boundary. As shown in FIG. 19, the two tangent vectors 66 are not parallel. This indicates a discontinuity between the curves and between the surfaces at the new vertex 64. The angle between the two tangent vectors 66 is a measure of the discontinuity. To improve the continuity of the boundary, the two tangent vectors 66 may be modified so as to be equal and opposite, for example, by modifying each tangent vector 66 by a common amount. In some embodiments, the tangent vectors 66 are modified by different amounts. In some embodiments, the location of one or more of the new and/or old vertices is changed to reduce the angle between the tangent vectors 66. In some embodiments, the continuity is improved only if the angle is greater than a threshold, for example, 1 degree or 1 percent. FIG. 20 shows that, after modification, the tangent vectors 66 of the new vertex 64 are equal and opposite. Accordingly, a curve through the new vertex 64 from one surface to the other is G1 continuous. In some embodiments, the new and/or old vertices near the new vertex 64 are modified so that the curve through the new vertex 64 from one surface to the other is G2 continuous. FIG. 21 shows the surfaces 48 after the continuity between the surfaces 48 near the valence 5 vertex 52 has been improved. Once the tangent vectors are satisfactory, each of the affected surfaces is regenerated based on data which includes the new vertices and tangent vectors.

Figure 22:
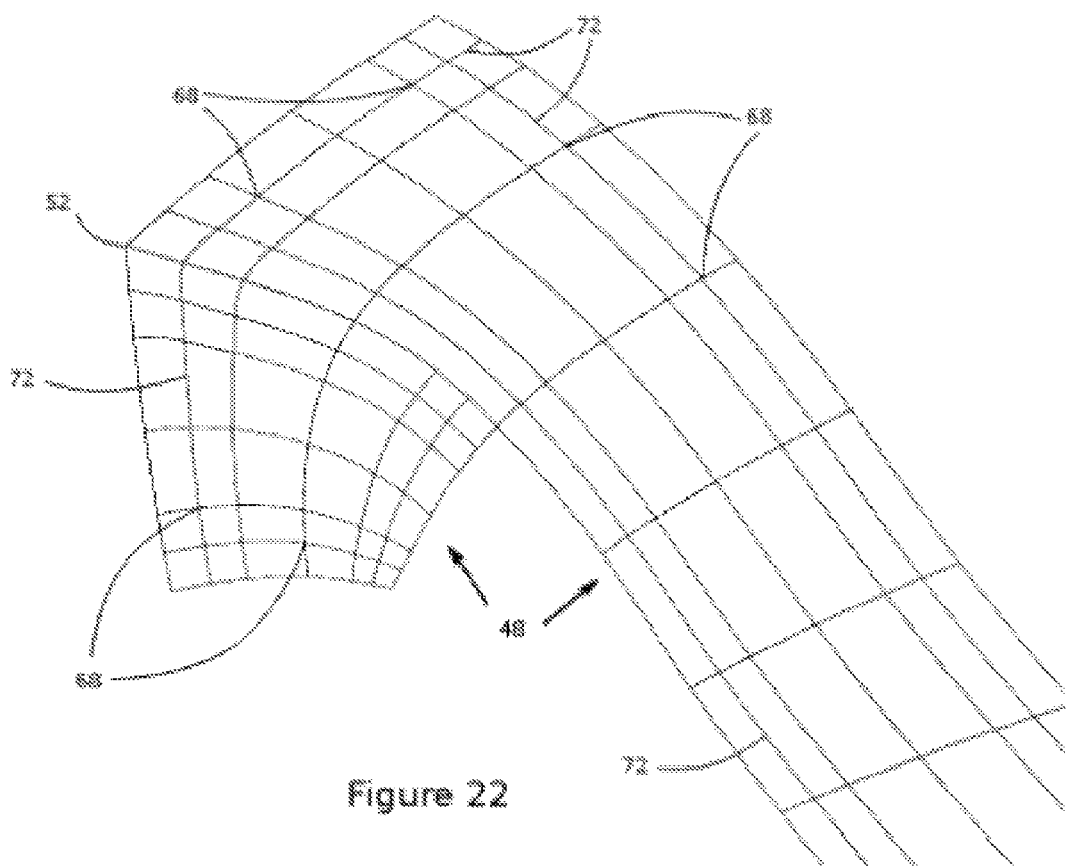

In some embodiments, improvement of the continuity near the non-valence 4 vertex is repeated. For example, if the angle between the tangent vectors 66 prior to modification is greater than a threshold, the improvement process may be repeated. FIG. 22 shows the surfaces 48 after the continuity between the surfaces near the valence 5 vertex 52 has been improved a second time. As shown, the second improvement process added new vertices 68 and continuous curves 72 including the new vertices 68.

Figure 23:
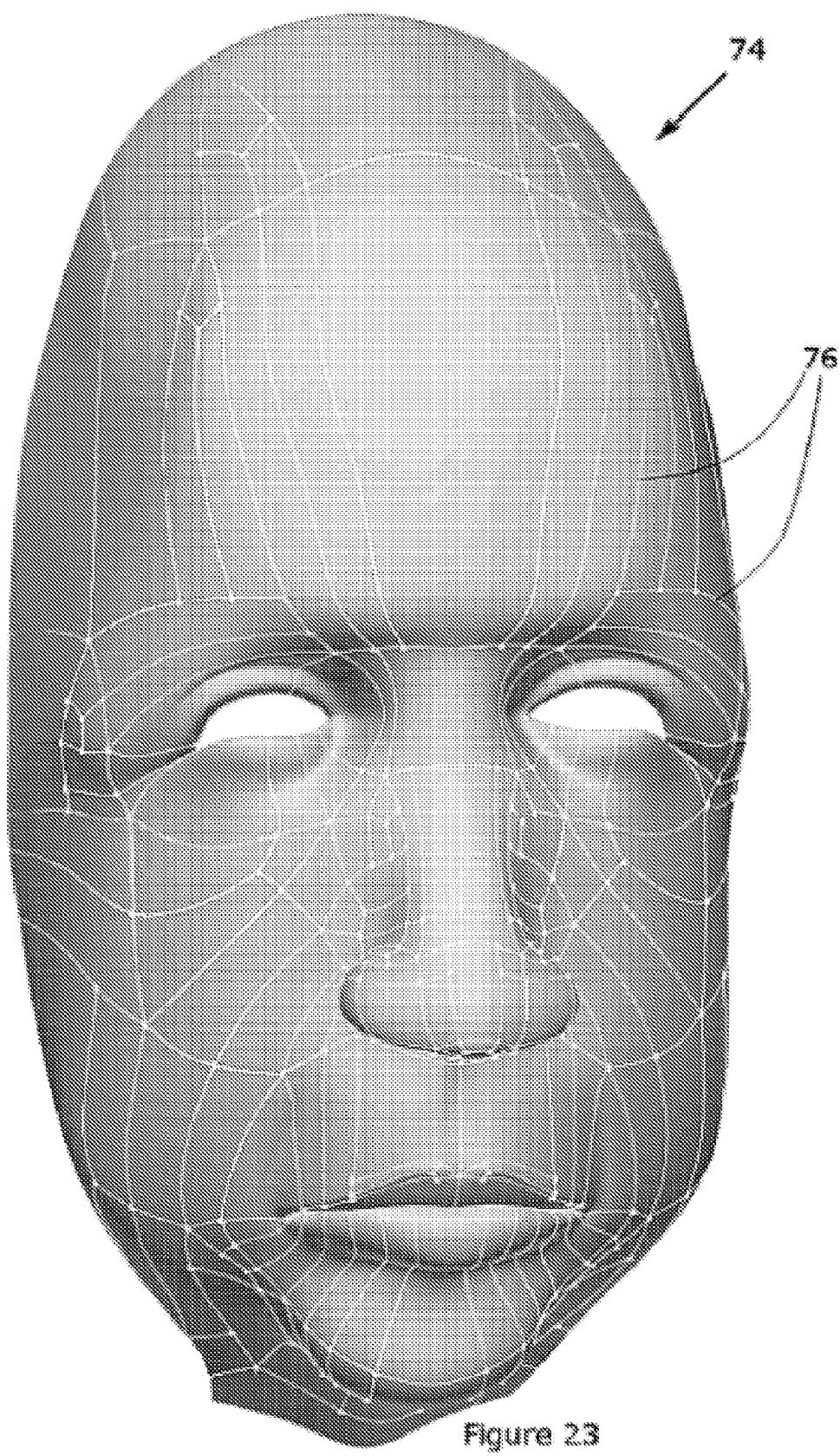
FIGS. 23-25 are graphical illustrations of continuous BREP object data generated by the processes describe with reference to FIGS. 3-22.
Figure 24:
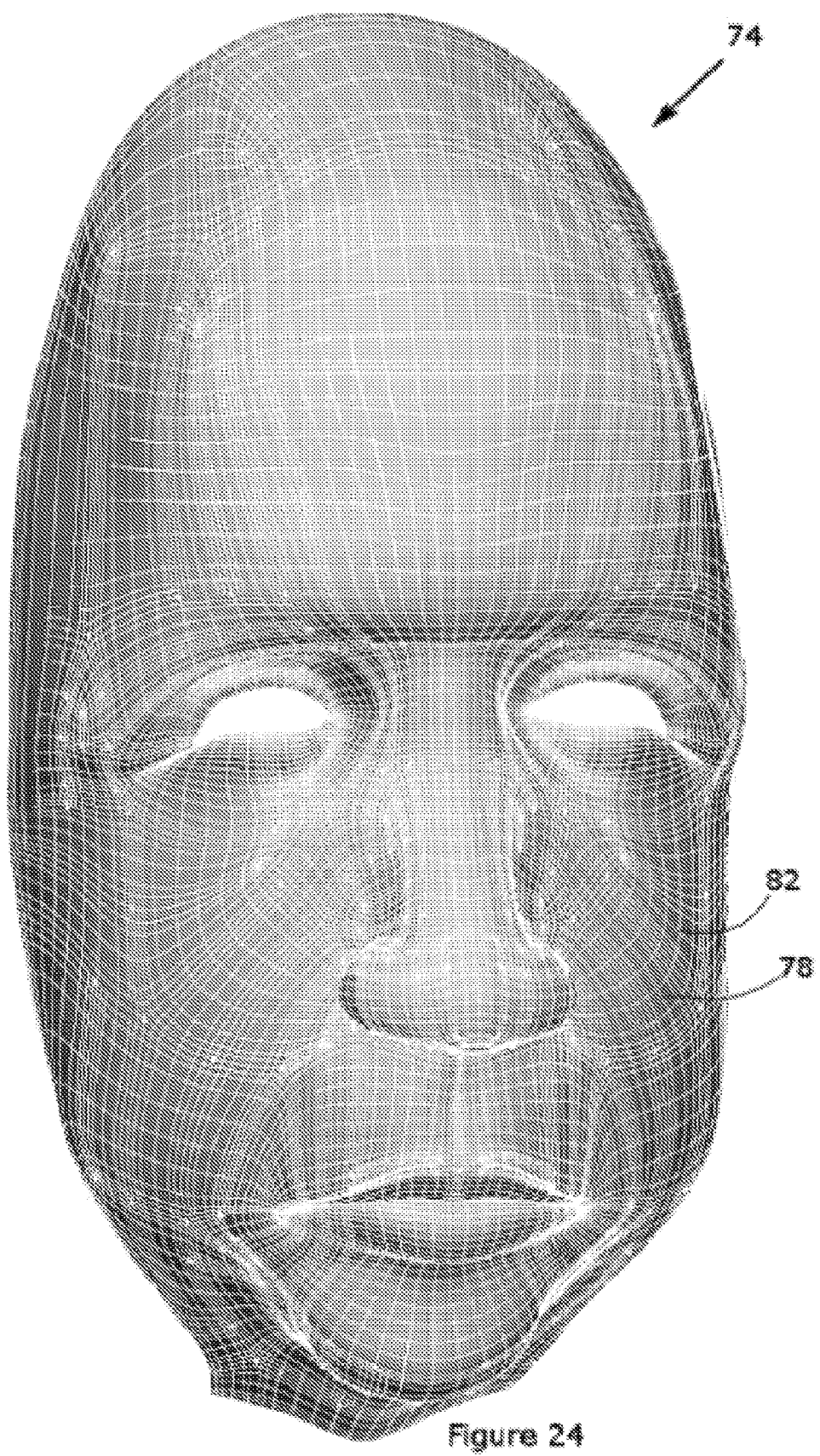

FIG. 23 shows the continuous surface 74 generated by the method of FIG. 3, with the surface boundaries 76. FIG. 24 shows the continuous surface 74 generated by the method of FIG. 3, with the continuous curves 78 and vertices 82.

The generated BREP 74 may contain a NURBS surface, and may be G2 continuous at all or substantially all points, and may be G1 continuous at points which are not G2 continuous. Once data representing the continuous BREP object 74 is generated, the data may be stored in a non-transitory computer readable medium, such as a memory storage device. The data may be used to generate an electronic or printed image of the continuous BREP object. The data may also be used to generate a physical representation or instructions for generating a physical representation of the continuous BREP.

Figure 25:

FIG. 25 shows a zebra stripe analysis 82 of the continuous BREP 74 generated by the method of FIG. 3. As shown the zebra stripe analysis indicates that the continuity of the continuous BREP generated by the method of FIG. 3 is excellent.

Once data representing the continuous BREP object 74 is generated, the BREP data may be edited by a designer. For example, if the designer decides a new feature should be added to or removed from the BREP object 74, the designer performs BREP operations on the BREP object 74. The BREP operations may include operations such as Boolean operations, feature application, filleting, measuring, performing analysis, performing a query, shelling, sweeping, extruding, revolvinfg, trimming, skinning, and blending. Other BREP operations may be performed. Accordingly, the BREP object includes features and characteristics which were created in the polygonal data of FIG. 1 and also includes any new features added using the BREP operations.

Certain features are added to the BREP object using BREP operations performed on the BREP object. Such features include, for example, features which are added to the generally defined object. For example, such features include holes, extrusions, fillets, and text.

Certain characteristics of the object, such as a shape or certain features, may be created by modifying the polygonal data using mesh operations. Such characteristics include characteristics which generally define the object. For example, in BREP object 74, the characteristics which define the object as a human head, such as its general shape, the eyes, the nose, and the mouth are characteristics which were designed in the polygonal data. The mesh operations are performed on the polygonal data to generate the characteristics. Such mesh operations may include, for example, extruding, bevelling, splitting faces, inserting vertices, and moving edges and vertices. Other mesh operations can be performed.

After the BREP object is generated and edited, a designer may decide that a particular characteristic should be added or modified which is best accomplished by operating on the polygonal data with one or more mesh operations. Conventionally, to generate the particular characteristic, the designer must discard the BREP object including any features added to the BREP object using BREP operations. Conventionally, the designer must retrieve the polygonal data, generate the particular characteristic in the polygonal data using mesh operations, and generate a new BREP object based on the modified polygonal data having the generated particular characteristic. The new BREP object includes the particular characteristic generated in the polygonal data. However, the new BREP object does not include the features added to the previous BREP object using BREP operations. To include the previously added features, the designer repeats the BREP operations previously performed on the discarded BREP object to regenerate those features. Such a process is unnecessarily cumbersome and therefore costly.

Figure 26:
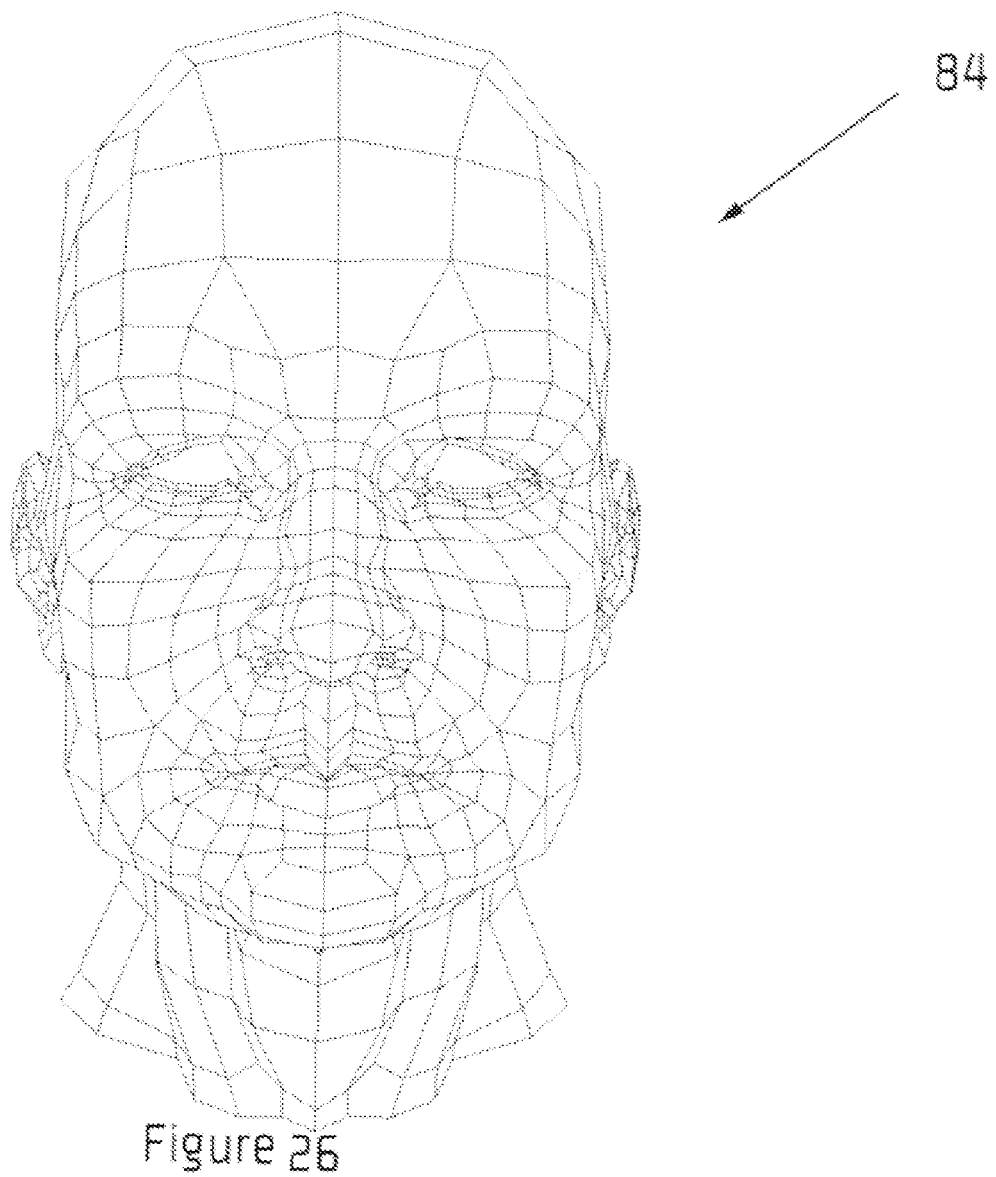
FIG. 26 is a graphical representation of polygonal data.

FIG. 26 is a graphical representation of polygonal data 84. The polygonal data 84, shown in FIG. 26 differs from the polygonal data 1 shown in FIG. 1 in that FIG. 26 is a control mesh, and the polygonal data of FIG. 1 has been subdivided one or more times. The polygonal data discussed herein and on which the methods and systems discussed herein operate may be a control mesh, subdivided data, or another type of polygonal data. To generate the polygonal data 84, various mesh operations, such as those discussed above, are performed. In addition, the geometries of the polygonal data each have a unique identification or a tag, such as a number. For example, each point, edge, and polygonal face may have a unique tag. In some embodiments, each edge has a tag based on the tags of the points included in the edge. Likewise, in some embodiments, each polygonal face has a tag based on the points or edges included in or bounding the polygonal face. In some embodiments, tags include an identifier of the type of geometry, indicating, for example, that the geometry is a point, an edge, or a polygonal face. In reference to geometries of polygonal data, the terms point, edge, and polygonal face are typically used herein. Other terms may also be used.

Figure 27:
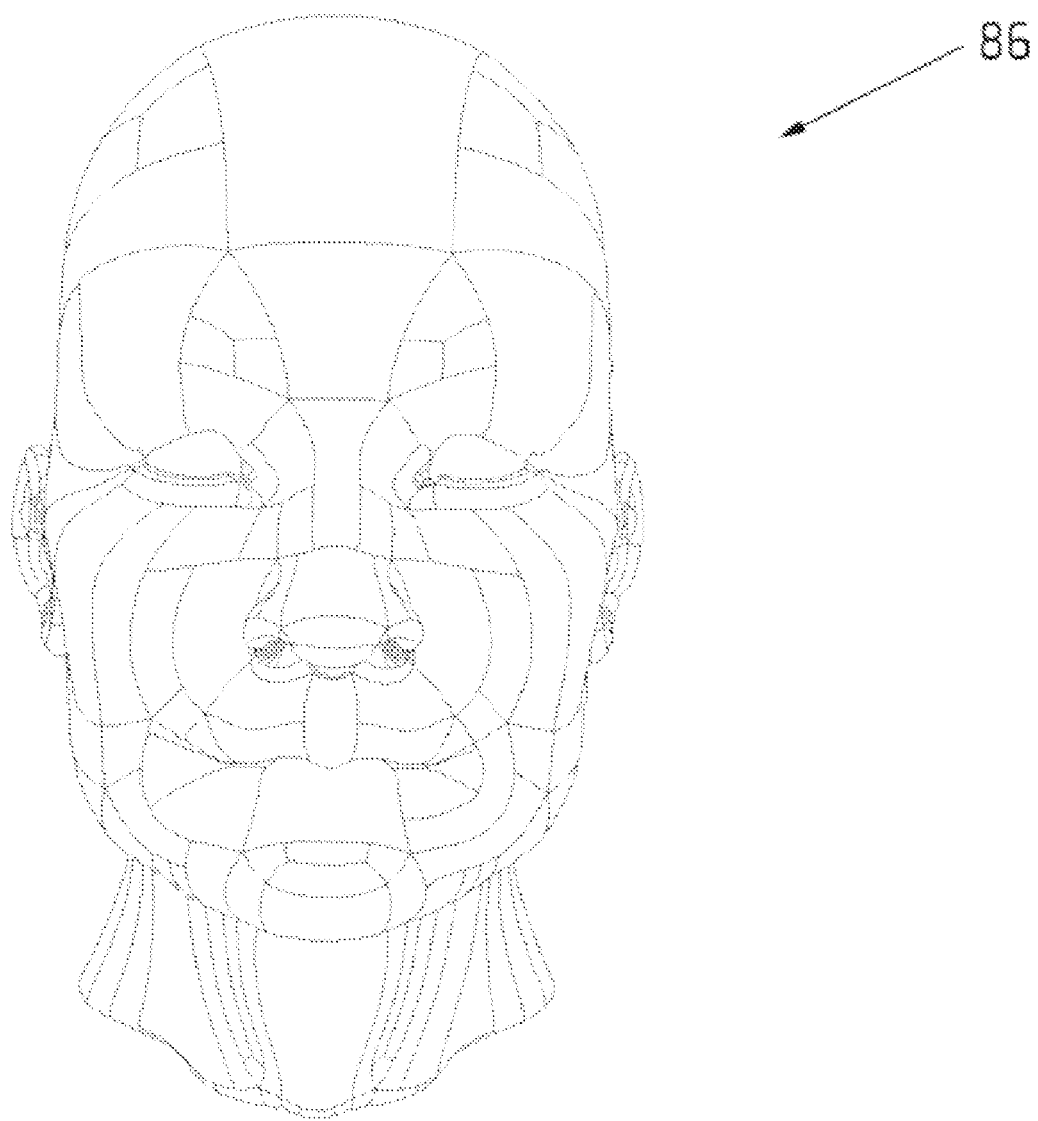
FIG. 27 is a graphical representation of a BREP object, which has been generated based on the polygonal data of FIG. 26.

FIG. 27 is a graphical representation of a BREP object 86, which has been generated based on the polygonal data 84, of FIG. 26. A method having features such as those discussed above may be used to generate the BREP object 86. Other methods may alternatively be used. The BREP object 86 includes various geometries, such as vertices, curves, and surfaces. And the geometries of the BREP object 86 have a unique identification or a tag, such as a number. Because the BREP object 86 is generated based on the polygonal data 84, the geometries of the BREP object 86 correspond to various geometries of the polygonal data 84. In addition, the tags of the geometries of the BREP object 86 may be based on or may be equivalent to the tags of the corresponding geometries of the polygonal data 84. For example, each vertex, curve, and surface of the BREP object 86 may have a unique tag which is based on or is equivalent to the corresponding point, edge, and polygonal face of the polygonal data 84. In reference to geometries of BREP object data, the terms vertex, curve, and surface are typically used herein. Other terms may also be used.

Figure 28:
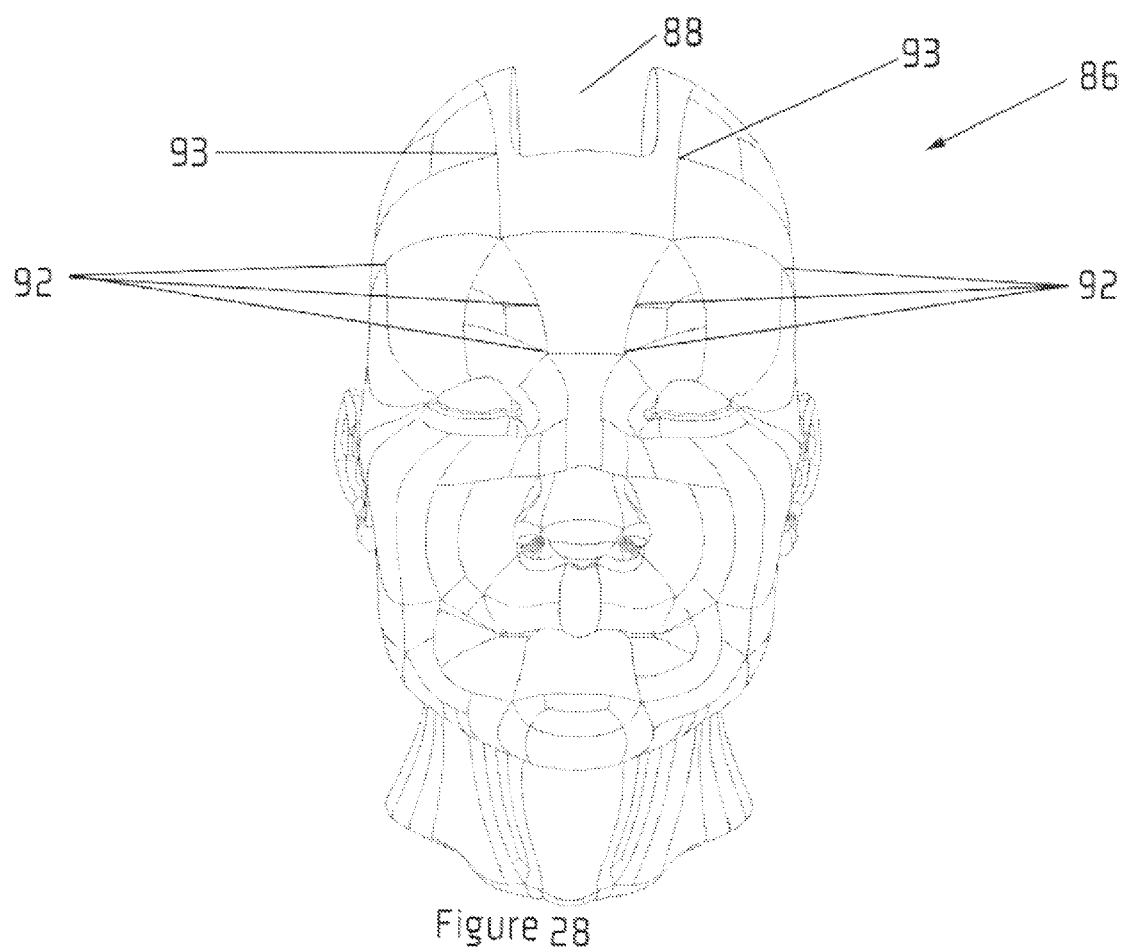
FIGS. 28 and 29 are graphical representations of the BREP object of FIG. 27, having features which have been added using BREP operations.

FIG. 28 is a graphical representation of the BREP object 86, having features which have been added using BREP operations. In the BREP object 86 of FIG. 28, a notch 88 has been added using Boolean BREP operations. Other BREP operations may alternatively or additionally be performed.

In the example of FIG. 28, a BREP object (not shown) is placed so as to intersect the BREP object 86 according to the designer's preference, and the Boolean BREP operations are performed. In some embodiments, either automatically in response to an indication from the designer to perform the Boolean BREP operations, or in response to a separate indication from the designer, certain attributes of the Boolean BREP operations are recorded so that the operations can be repeated to automatically add the notch 88 to another BREP object. For example, operation and operand information may be recoded. In addition, tags of modified or reference geometries may be recorded. In some embodiments, an identifier of a relative position in a sequence of operations is also recorded. Additionally, certain characteristics or parameters of the operations and operands are recorded. For example, the location, the axis direction, the width, the length, and the corner radius of the notch 88 may be recorded. Other characteristics may be recorded, and other operations and other shapes may use these and/or other characteristics and/or parameters.

In some embodiments, the characteristics or parameters are recorded automatically, for example, as part of the process by which the BREP operations are performed. For example, once the designer provides an instruction to the computer system to perform the operation, the characteristics or parameters may be automatically recorded. In some embodiments, a separate instruction or indication may be given by the designer which causes the computer system to record the characteristics and/or parameters associated with one or more operations.

In some embodiments, the designer or the system may record an identifier for the recorded operation. For example, the operations and information recorded related to the generation of the notch 88 may be recorded and associated with a text identifier, such as "notch" In some embodiments, operations for generating multiple features may be recorded with their associated characteristic and parametric information and may be given a collective identifier. For example, the operations and information recorded related to the generation of multiple notches may be recorded and associated with a text identifier, such as, "notches."

The characteristics or parameters may have location information which is based on a general coordinate system used for identifying location and relative distance information for the BREP object 86. For example, if a three-dimensional Cartesian coordinate system is used, an origin point is defined as location (0,0,0), and other locations are defined relative to the origin. Other coordinate systems may additionally or alternatively be used.

The characteristics or parameters may have location information which is based on a location of a geometry of a feature added to the BREP object 86. For example, a first added feature having certain geometries, such as vertices, curves, or surfaces may be added. As part of adding the feature, tags for the geometries of the feature are generated and associated with the geometries. A second feature may be added which is associated with the first feature. The location information recorded for the second feature may have location information which is referenced to a tagged geometry of the first feature.

The characteristics or parameters may have location information which is based on a location of a tagged geometry of the BREP object 86. For example, the BREP object 86 has numerous geometries, such as vertices, curves, and surfaces, each of which has a unique tag. A feature may be added which is associated with one or more of the tagged geometries. The location information recorded for the added feature may be referenced to one or more of the tagged geometries of the BREP object 86.

In some embodiments, multiple types of location information references are recorded for an operation or for an added feature. For example, an operation or an added feature may have associated location information recorded which is referenced to any or all of the general or global coordinate system, one or more geometries of another added feature, and one or more geometries of the BREP object 86.

In some embodiments, the designer selects which types of location information references are recorded with an added feature. In some embodiments, the designer selects multiple types of location information references for a single aspect of the added feature. In some embodiments, the designer selects multiple alternative location information references for a single aspect of the added feature. Accordingly, as part of regenerating the aspect, the designer chooses from the multiple alternative types of location references.

Figure 29:
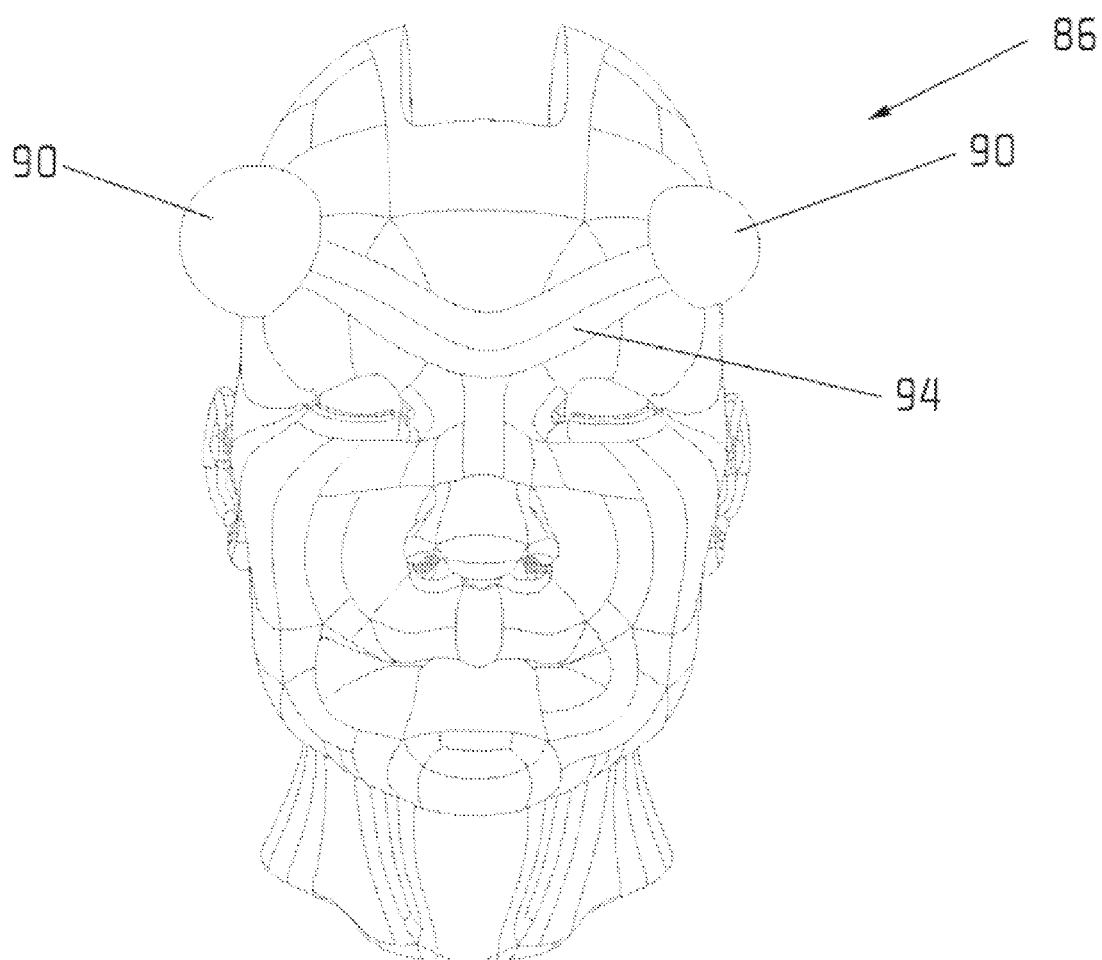

FIG. 29 is a graphical representation of the BREP object 86, having additional features which have been added using BREP operations. In this example, a molding 94 has been added using one or more BREP operations. To add the molding 94, the designer selects BREP vertices 92, shown in FIG. 28, to which the molding 94 is referenced. With reference to the BREP vertices 92, the designer generates and adds the molding 94. As shown in FIGS. 28 and 29, the generated molding 94 is positioned along or through the BREP vertices 92.

As discussed above with regard to the performance of the BREP operations used to generate the notch 88, certain characteristics, parameters, and operation identifiers related to the operations for generating the molding 94 are recorded. The recorded characteristics and parameters may, for example, include an identifier of the type of feature, such as a molding, cross-sectional profile information of the molding 94, and the tags of the BREP vertices 92 to which the molding 94 is referenced or attached.

Also shown in FIG. 29, bumps 90 are generated on the ends of the molding 94. The bumps 90 may be generated using various BREP operations. Characteristics or parameters related to the bumps 90 are also recorded. For example, a radius or other information regarding a curvature profile of the bumps 90 may be recorded. In some embodiments, an identifier or tag of each of the ends of the molding 94 are recorded and associated with the recorded operations which create each of the bumps 90. In addition, the designer may record one or more identifiers, for example, "bump 1," "bump 2," and/or "bumps" for the recorded bump generation operations and the characteristic and parametric information associated with the bump generation operations.

As discussed above, the notch 88 may have location information which is referenced to a general origin for the BREP object 86. The bumps 90 may have locations which are identified with reference to the tags of the ends of the molding 94. In addition, the molding 94 may have location information which includes the tags of BREP vertices 92 to which it is referenced.

Accordingly, in some embodiments, operations for generating some features have location identification information which is referenced to any one or more of a global reference coordinate system, one or more geometries of the BREP object 86, and one or more geometries of a modification of the BREP object 86 using one or more BREP operations.

In some embodiments, certain operations for generating some features do not include any location information which is identified with reference to the general origin for the BREP object 86. In some embodiments, certain operations for generating some features do not include any location information which is identified with reference to geometries of the BREP object 86. In some embodiments, certain operations for generating some features do not include any location information which is identified with reference to a modification of the BREP object 86 using one or more BREP operations.

In some embodiments, location information for one or more features or operations includes multiple types of referencing. For example, location information may be related to the global coordinate system, for example, in one dimension, and related to geometries of the BREP object 86, for example, in another dimension. Furthermore, in some embodiments, location information for one or more features or operations includes multiple types of referencing for a single aspect of an added feature.

Figure 30:
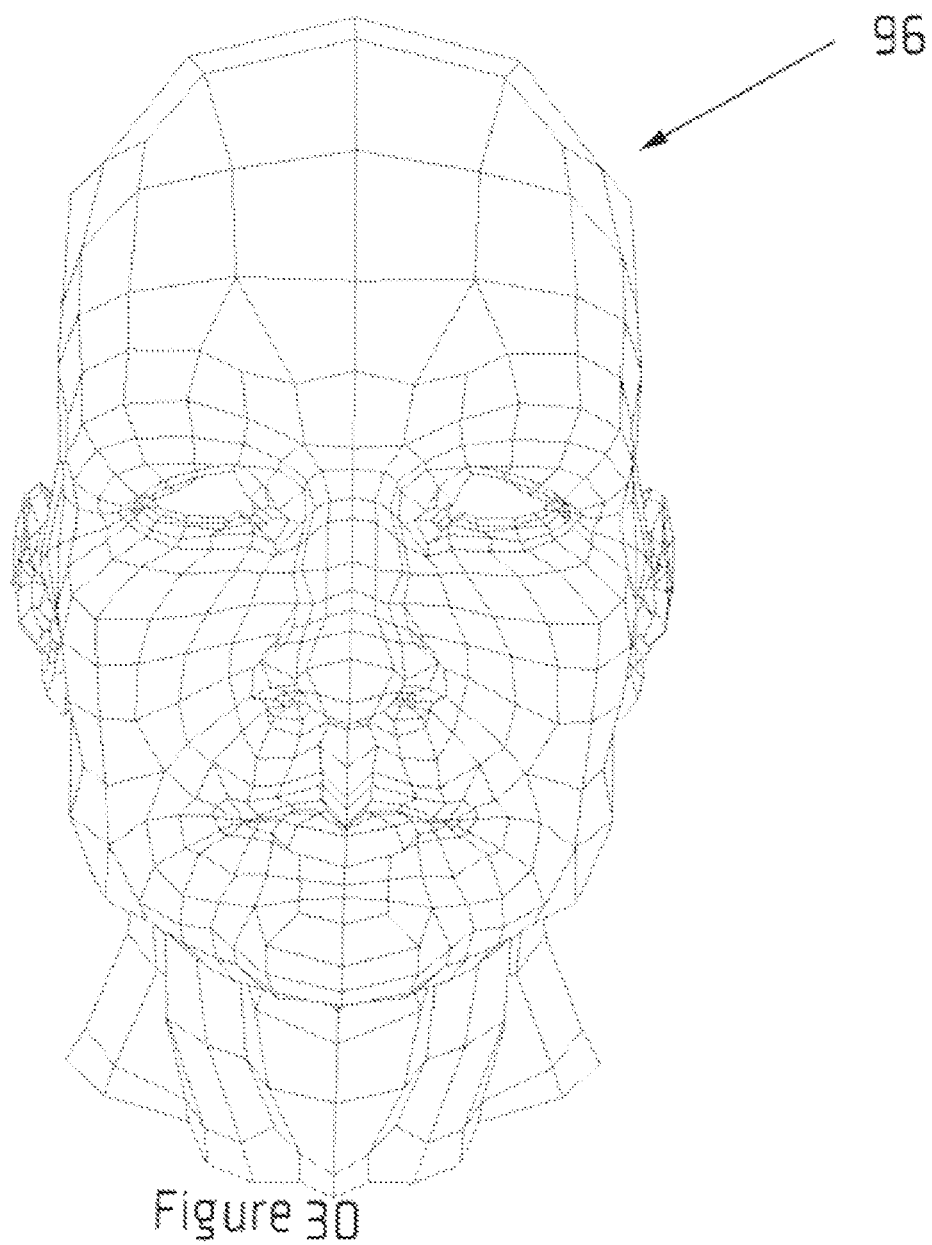
FIG. 30 is a graphical representation of polygonal data.

In this example, after adding the molding 94, the designer may decide that the forehead should have a distorted shape. Such a change in the general shape may be conveniently achieved by performing mesh operations on the polygonal data. FIG. 30 is a graphical representation of polygonal data 96. It is identical to the polygonal data 84 shown in FIG. 26, which is the basis for the BREP object 86 of FIG. 27, to which the notch 88, molding 94, and bumps 90 were added with the BREP operations as shown in FIGS. 28 and 29. As shown in FIG. 30, the features added with the BREP operations on the BREP object 86, shown in FIG. 29, are not represented in the polygonal data 96.

Figure 31:
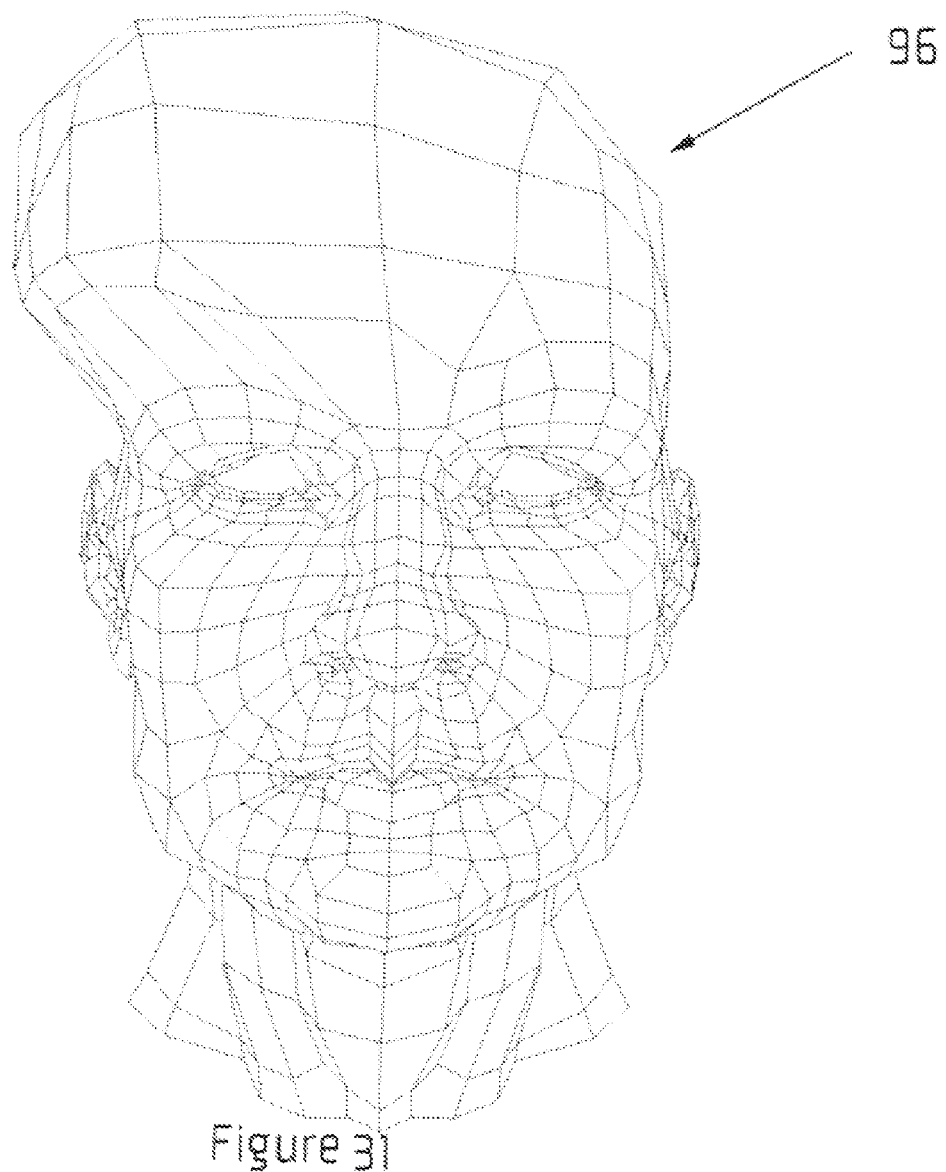
FIG. 31 is a graphical representation of the polygonal data of FIG. 30 having modified features.

FIG. 31 is a graphical representation of the polygonal data 96 having the forehead distorted according to the designer's preference. To distort the forehead, the designer performs certain mesh operations, such as those discussed above, on the polygonal data 96. In some embodiments, other mesh operations may be performed on the polygonal data 96.

Figure 32:
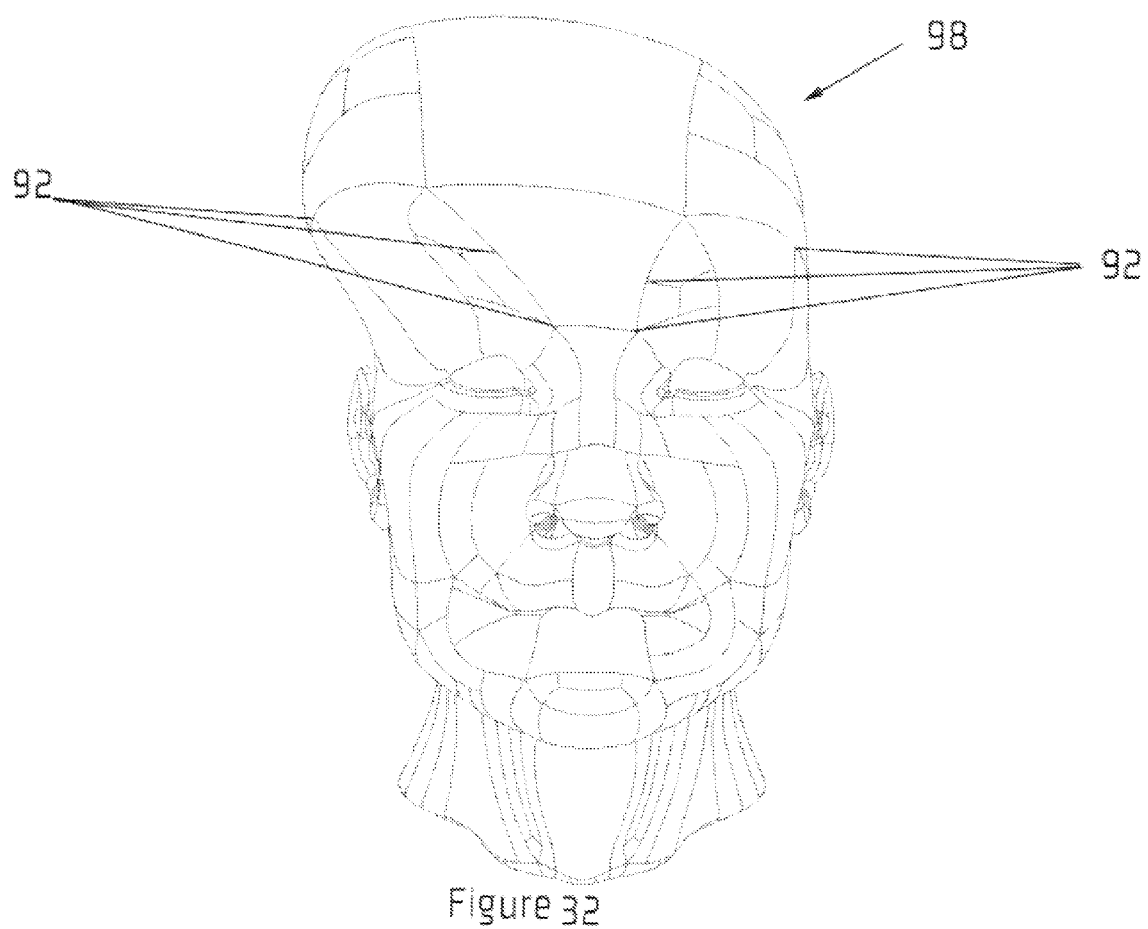
FIG. 32 is a graphical representation of a BREP object, which has been generated based on the polygonal data of FIG. 31.

FIG. 32 is a graphical representation of a BREP object 98, which has been generated based on the polygonal data 96 of FIG. 31. A method having features such as those discussed above may be used to generate the BREP object 98. Other methods may alternatively be used. The method used may be the same or similar or different than the method used to generate BREP object 86 of FIG. 27.

As part of the generation of the BREP object 98, tags of the geometries of BREP object 98 are generated based on the tags of the corresponding geometries of polygonal data 96 of FIG. 31. Accordingly, to the extent that geometries of the polygonal data 96 correspond to the geometries of the polygonal data 84 of FIG. 26, the tags of the geometries of BREP object 98 correspond to the tags of the geometries of BREP object 86 of FIG. 27. Therefore, tags recorded with the operations performed on BREP object 86 are found in the data for BREP object 98.

As shown in FIG. 32, the distorted forehead feature or characteristic added to the polygonal data 96 of FIG. 31 is represented in the BREP object 98. In contrast, the features previously added to the BREP object 86 using the BREP operations discussed with reference to FIGS. 28 and 29, namely, the notch 88, the molding 94, and the fillets 90 are not represented in the BREP object 98. However, because the BREP operations and various characteristics and parameters of the BREP operations and operands were recorded, the features generated by the BREP operations can be regenerated and added to the BREP object 98 automatically or by the computer system in response to a command from the designer to recreate the features.

For example, the designer may select a previously performed operation from a list of previously performed operations. In some embodiments, the designer may select a previously added feature from a list of previously added features. In the example of FIGS. 26-33, the list of previously added features may include the identifiers recorded with the previously performed BREP operation information—"notch," "molding," "bump 1," "bump 2," and "bumps." To recreate a feature, the designer, may, for example, access the list, select an identifier designating a desired feature or operation, and provide an indication to the computer system to add the feature or perform the operation associated with the selected identifier. In some embodiments, the designer may provide an indication to the computer system to regenerate a group or all of the previously created features. In response to the indication, the computer system accesses the recorded BREP operations, operand, location, and tag information associated with the selected identifier and regenerates the previously added features by performing the previously performed BREP operations. In some embodiments, each of a series of steps to recreate the previously added features is performed by the computer system in response to a separate indication given by the designer. In such embodiments, the designer observes each of the steps to ensure the results of the steps are desired.

Figure 33:
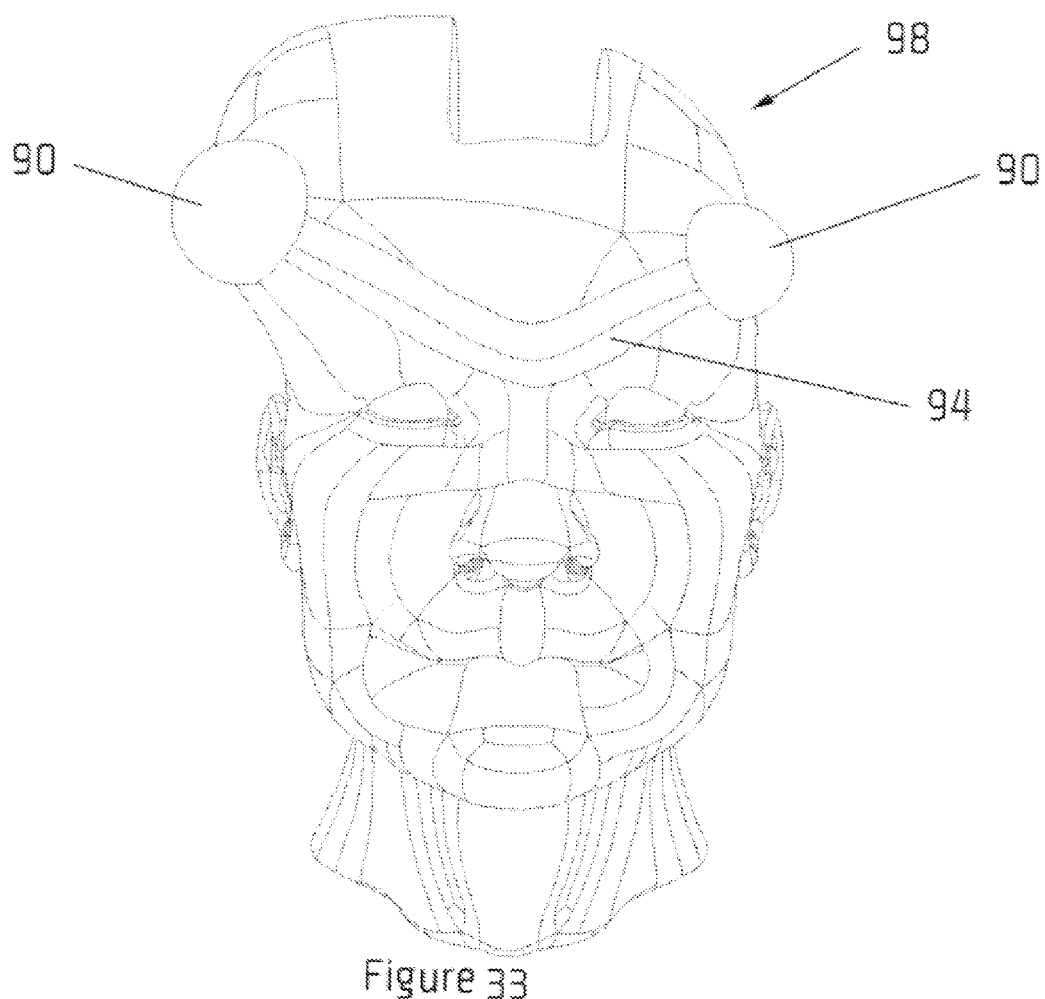
FIG. 33 is a graphical representation of a BREP object, which has been generated based on the polygonal data of FIG. 31 and to which the features previously created as shown in FIGS. 28 and 29 have been automatically added.

FIG. 33 is a graphical representation of BREP object 98, which has been generated based on the polygonal data 96 of FIG. 31 and to which the features previously created as shown in FIGS. 28 and 29 have been automatically added. The features have been added using a method of selection and regeneration such as that described above.

Comparison of FIGS. 29 and 33 shows that the notch 88 in FIG. 33 is located at a position which is identical to the positions at which the notch 88 in FIG. 29 is located, as referenced to a general coordinate system origin. To achieve this, when the notch 88 shown in FIG. 28 was added to the BREP object 86, the position of the notch 88 with reference to the general coordinate system was recorded. And when the holes 88 were automatically regenerated, as shown in FIG. 33, the recorded position was used to identify location information for the regenerated notch 88. Therefore, the distortion operation did not shift the location of the notch 88 as referenced to the general coordinate system and to the general position of BREP object 86 shown in FIGS. 28 and 29.

In some embodiments, as part of the addition of the notch 88 as shown in FIG. 28, the system may additionally record location information for the holes with reference to one or more tagged geometries of the BREP object 86. For example, the system may record that the location of a lower boundary of the notch 88 is aligned with vertices 93. With the additionally recorded location information, when the lower hole 88 is regenerated, the designer may select which location information to use. The designer may select the location referenced to the general coordinate system, as shown in FIG. 33, or the location resulting from the lower boundary of the notch 88 being aligned with vertices 93. In some embodiments, the designer may alternatively select a location which was not recorded as part of generating the notch 88.

In addition, as shown in FIG. 33, the bumps 90 of FIG. 33 are located at the ends of the molding 94 of FIG. 33. Accordingly, the bumps 90 are each located in positions which are referenced to a tagged geometry of a regenerated feature, the ends of the molding 94. To achieve this, when the bumps 90 shown in FIG. 28 were added to the BREP object 86, the positions of the bumps 90 with reference to the tagged ends of the molding 94 were recorded. And when the bumps 90 were automatically regenerated, as shown in FIG. 33, the recorded positions were used to identify location information for the regenerated bumps 90. Therefore, the distortion operation did not shift the location of the fillets bumps 90 as referenced to the ends of the molding 94 and to the BREP object 86 shown in FIGS. 28 and 29.

Furthermore, as shown in FIG. 33, the molding 94 is located along the distorted forehead, and is, therefore, located along positions referenced to a tagged geometry of the BREP object 98, the BREP vertices 92 shown in FIG. 32. Because the BREP vertices 92 were affected by the distortion of the forehead, the shape and position of the molding 94 in FIGS. 29 and 33 is different. To achieve this, when the molding 94 was added to BREP object 86, as shown in FIG. 29, tags for the BREP vertices 92 were recorded, and when the molding 94 was automatically regenerated, as shown in FIG. 33, the recorded tags of BREP vertices 92 were used to identify location information for the regenerated molding 94. Therefore, as indicated above, the distortion operation shifted the location of the BREP vertices 92, and the location of the regenerated molding 94 correspondingly shifted as compared to the previously added molding 94.

The various aspects, processes, and actions may be performed sequentially or in parallel. For example, a system capable of parallel processing may divide certain procedures among the available processing devices.

While various aspects, processes, actions, and systems have been described as being included in the embodiments discussed, the various aspects, processes, actions, and systems can be practiced with certain modifications. For example, the sequential order of the various aspects, processes, and actions may be modified. In addition, certain aspects, processes, and actions may be omitted, and other aspects, processes, and actions may be added.

What is claimed is:

1. A method of producing BREP data, the method comprising:

accessing electronic data defining a mesh of discrete data points;

generating a first continuous BREP data model based on the discrete data point mesh;

in response to a command from a user, performing one or more first BREP operations on the first continuous BREP data model to generate added or modified first continuous BREP features in a modified first continuous BREP data model;

after performing the first BREP operations, in response to a command from the user, performing one or more mesh operations on the discrete data point mesh to generate a modified mesh data model comprising one or more additional or modified mesh features, wherein the modified mesh data model does not include features corresponding with the added or modified first continuous BREP features of the modified first continuous BREP data model;

generating a second continuous BREP data model based on the modified mesh data model, wherein the second continuous BREP data model comprises one or more continuous second BREP features corresponding to the additional or modified mesh features of the modified mesh data model, and wherein the second continuous BREP data model does not include the added or modified first continuous BREP features of the modified first continuous BREP data model;

automatically performing one or more second BREP operations on the second continuous BREP data model to add the added or modified first continuous BREP features of the modified first continuous BREP data model to the second continuous BREP data model;

displaying the second continuous BREP data model on a display, wherein the displayed second continuous BREP data model includes the first and second continuous BREP features; and storing the second continuous BREP data model in a memory.

2. The method of claim 1, further comprising storing the one or more first BREP operations.

3. The method of claim 1, wherein storing the one or more first BREP operations comprises storing operation information and storing operand information.

4. The method of claim 3, wherein storing the operation information comprises storing instructions for modifying one or more geometries.

5. The method of claim 1, wherein storing the one or more first BREP operations comprises storing an identification of a geometric feature of the first continuous BREP data model.

6. The method of claim 5, wherein performing the second BREP operations comprises identifying a geometric feature of the second continuous BREP data model which corresponds to the identification.

7. The method of claim 1, wherein storing the one or more first BREP operations comprises storing location information of the first BREP operations.

8. The method of claim 6, wherein the location information comprises a plurality of location options for the first BREP operations.

9. The method of claim 1, wherein performing the second BREP operations comprises accessing the stored one or more first BREP operations.

10. The method of claim 1, wherein performing the second BREP operations comprises selecting a location for the second operations from a plurality of selectable recorded location information options for the second BREP operations.

11. The method of claim 1, wherein performing each of the first and second BREP operations comprises performing one or more of extruding a surface, performing a Boolean operation, a sweep, a revolve, and generating a fillet.

12. The method of claim 1, wherein performing the mesh operations comprises performing one or more of an extrude, a bevel, a split face, and a move.

13. A method of producing BREP data, the method comprising:

accessing electronic data defining a mesh of discrete data points;

generating a first continuous BREP data model based on the discrete data point mesh;

in response to a command from a user, adding a first continuous BREP feature to the first continuous BREP data model;

recording information related to the added first continuous BREP feature and related to adding the first continuous BREP feature;

after adding the feature, in response to a command from the user, performing one or more mesh operations on the discrete data point mesh to generate a modified mesh data model comprising one or more additional or modified mesh features, wherein the modified mesh data model does not include features corresponding with the added first continuous BREP feature;

generating a second continuous BREP data model based on the modified mesh data model, wherein the second continuous BREP data model comprises one or more continuous second BREP features corresponding to the additional or modified mesh features of the modified mesh data model, and wherein the second continuous BREP data model does not include the added first continuous BREP feature;

automatically regenerating the added first continuous BREP feature, whereby updated BREP data is generated, wherein the updated BREP data includes the added first continuous BREP feature;

displaying the updated BREP data on a display, wherein the displayed updated BREP data includes the first and second continuous BREP features; and storing the updated BREP data in a memory.

14. The method of claim 13, wherein recording the information comprises storing BREP operation and operand information for adding the first continuous BREP feature.

15. The method of claim 13, wherein recording the information comprises storing location information of the added first continuous BREP feature.

16. The method of claim 15, wherein the location information comprises a location of the added first continuous BREP feature with reference to a geometric feature of the first continuous BREP data model.

17. The method of claim 16, wherein the location information further comprises a location of the added first continuous BREP feature with reference to a general coordinate system.

18. The method of claim 15, wherein the location information comprises a plurality of location options for the added first continuous BREP feature.

19. The method of claim 13, wherein regenerating the first continuous BREP feature comprises selecting a location for the regenerated first continuous BREP feature from a plurality of alternative recorded location information options.

20. The method of claim 13, wherein regenerating the added first continuous BREP feature comprises identifying a geometric feature of the second continuous BREP data model which corresponds to a recorded identification of a geometric feature of the first continuous BREP data model.

\* \* \* \* \*